United States Patent
Woo et al.

(10) Patent No.: US 8,432,224 B1
(45) Date of Patent: Apr. 30, 2013

(54) POWER AMPLIFIER WITH BACK-OFF EFFICIENCY

(75) Inventors: Chong Woo, Fremont, CA (US); Stephen Frank, Felton, CA (US); Dongmei Cao, Irvine, CA (US); Baker Scott, San Jose, CA (US); George A. Maxim, Milpitas, CA (US)

(73) Assignee: Amalfi Semiconductor, Inc., Los Gatos, CA (US)

( * ) Notice: Subject to any disclaimer, the term of this patent is extended or adjusted under 35 U.S.C. 154(b) by 0 days.

(21) Appl. No.: 12/893,653

(22) Filed: Sep. 29, 2010

Related U.S. Application Data

(60) Provisional application No. 61/246,762, filed on Sep. 29, 2009, provisional application No. 61/246,672, filed on Sep. 29, 2009, provisional application No. 61/246,740, filed on Sep. 29, 2009, provisional application No. 61/246,744, filed on Sep. 29, 2009, provisional application No. 61/246,680, filed on Sep. 29, 2009.

(51) Int. Cl.
  *H03G 3/30* (2006.01)
(52) U.S. Cl.
  USPC .......................................... 330/285; 330/279
(58) Field of Classification Search .................. 330/278, 330/279, 285, 297, 310
  See application file for complete search history.

(56) References Cited

U.S. PATENT DOCUMENTS

| | | | | |
|---|---|---|---|---|
| 5,652,547 | A * | 7/1997 | Mokhtar et al. | 330/279 |
| 7,288,991 | B2 * | 10/2007 | Ripley | 330/285 |
| 7,336,127 | B2 * | 2/2008 | Kennan | 330/124 R |

* cited by examiner

*Primary Examiner* — Khanh V Nguyen
(74) *Attorney, Agent, or Firm* — Paul Davis; Goodwin Procter LLP

(57) ABSTRACT

A power amplifier system is provided with a signal path including driver stages and output stages. A power control element has one or more control ports and uses one or more nonlinear control characteristics.

18 Claims, 49 Drawing Sheets

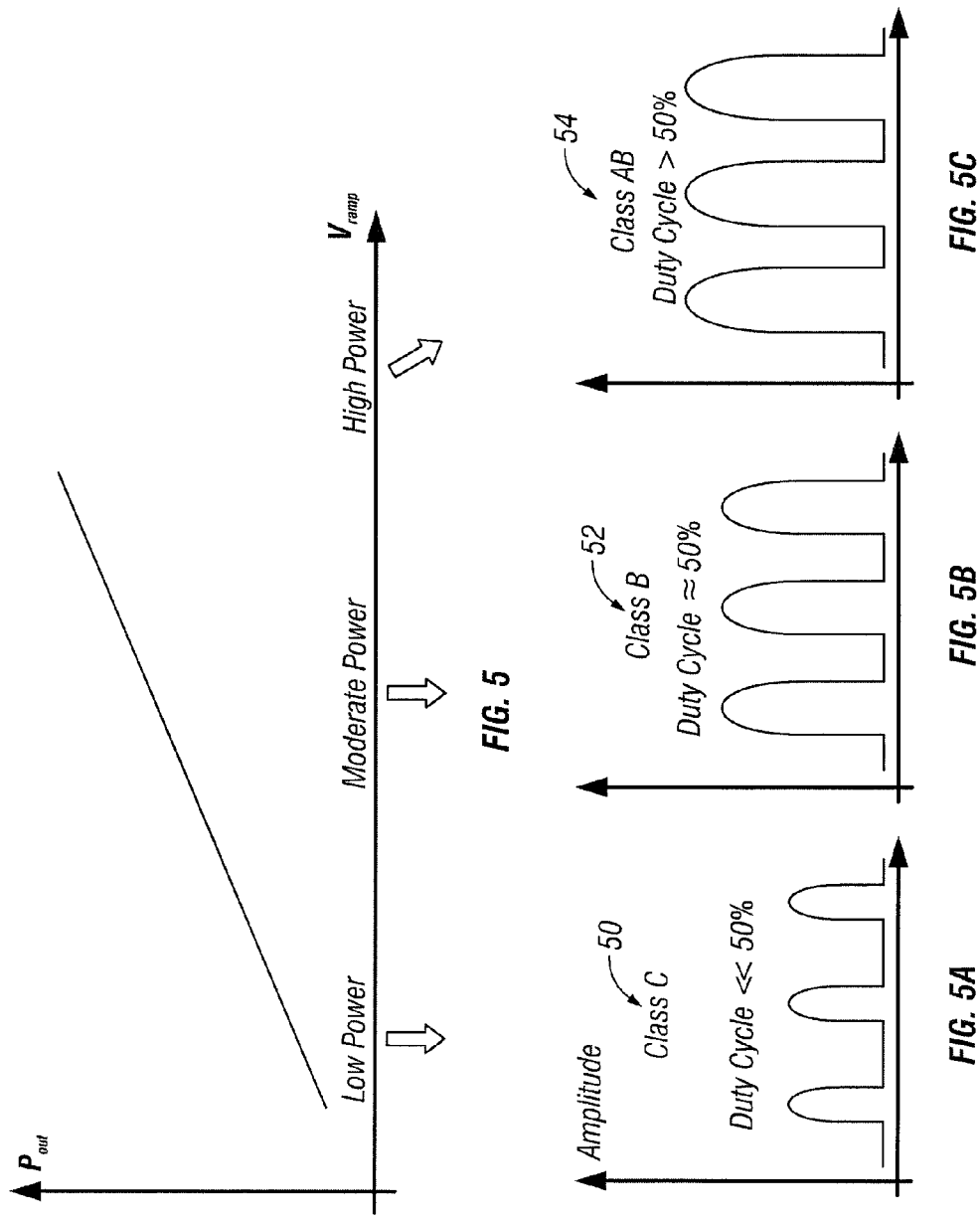

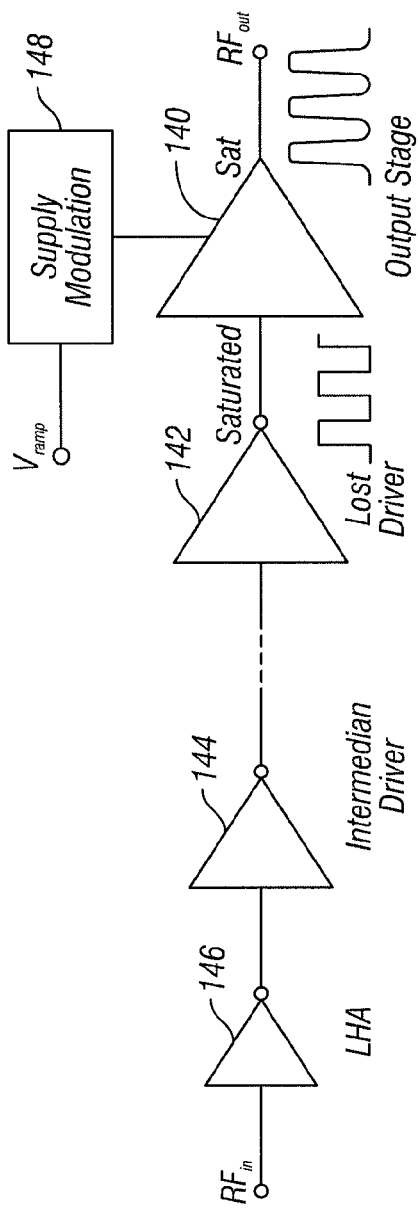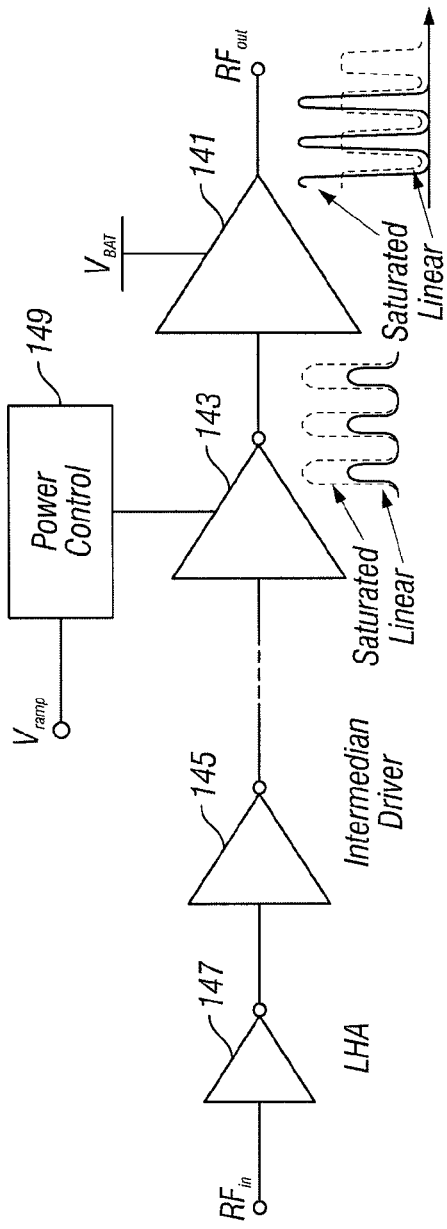
FIG. 14A
FIG. 14B

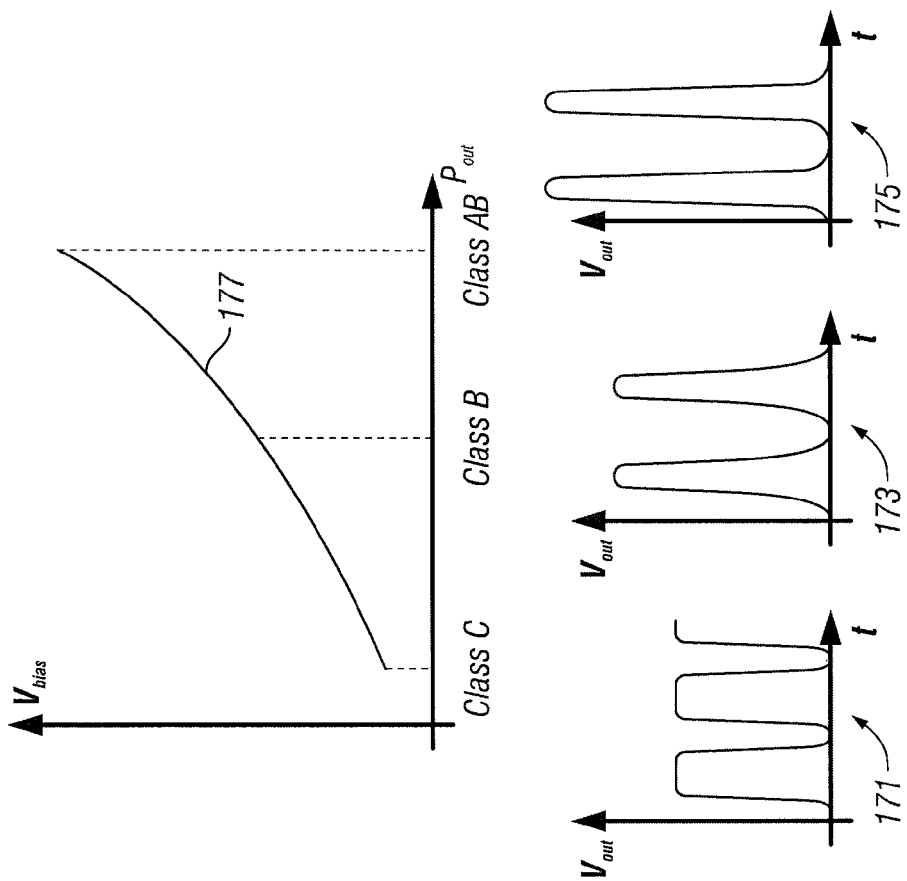
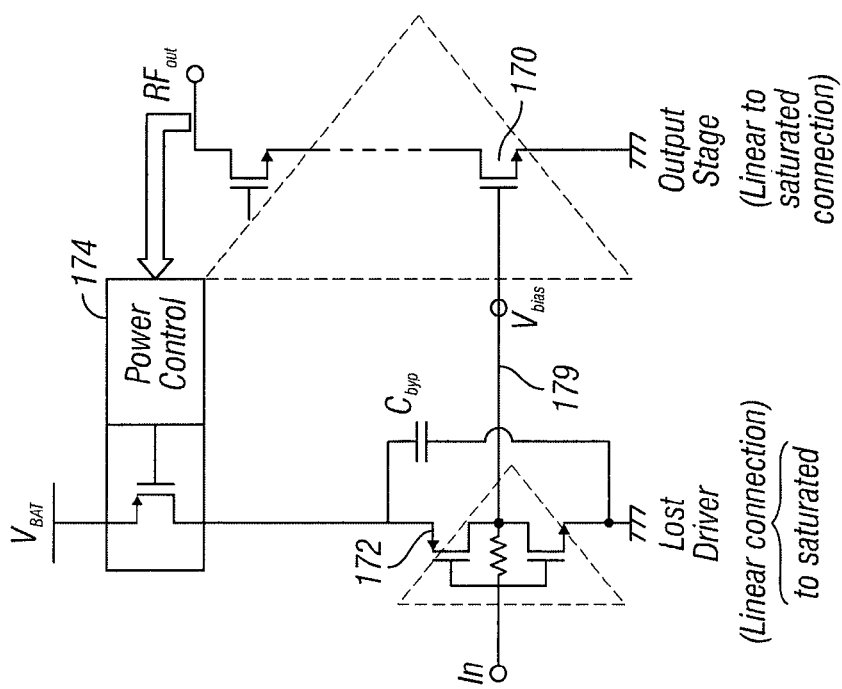
FIG. 17A
FIG. 17B

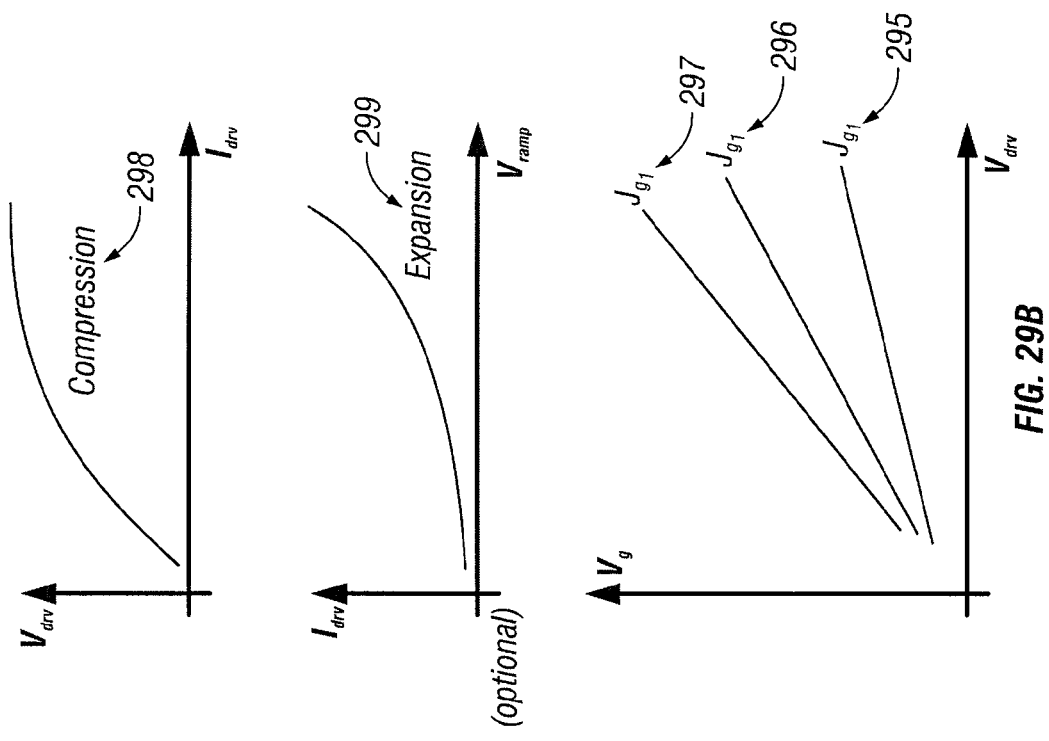
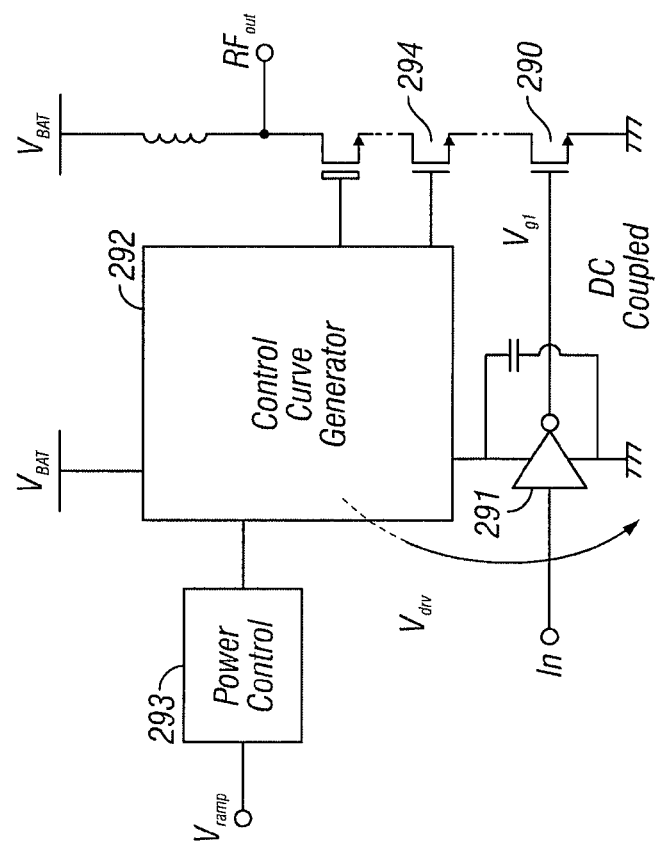
FIG. 29B
FIG. 29A

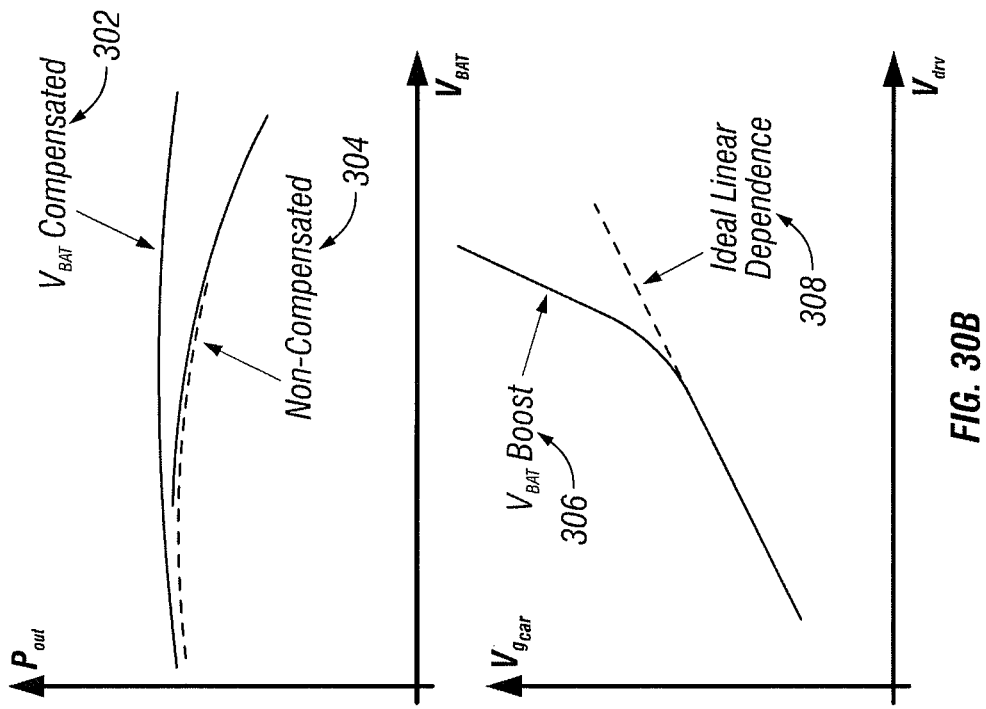
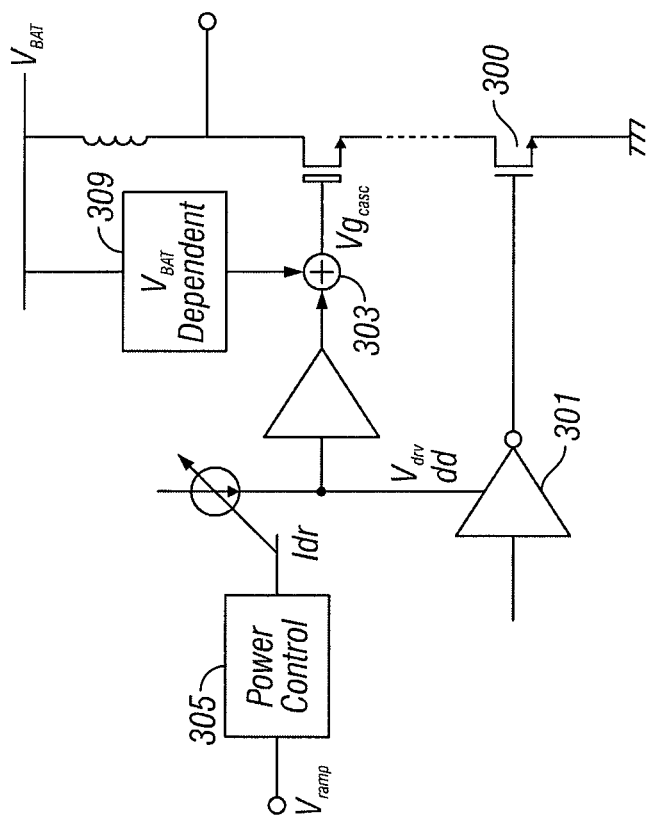
*FIG. 30A*
*FIG. 30B*

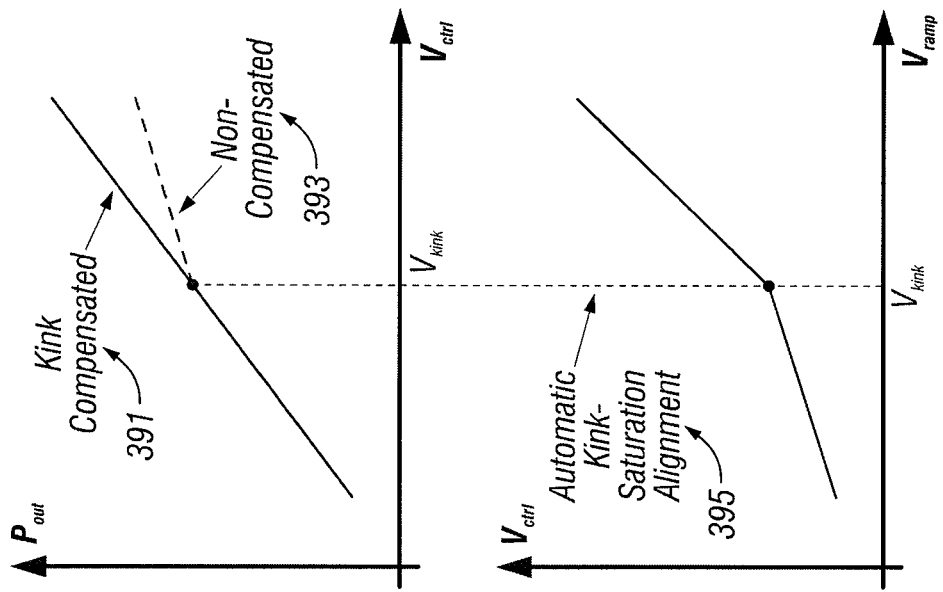
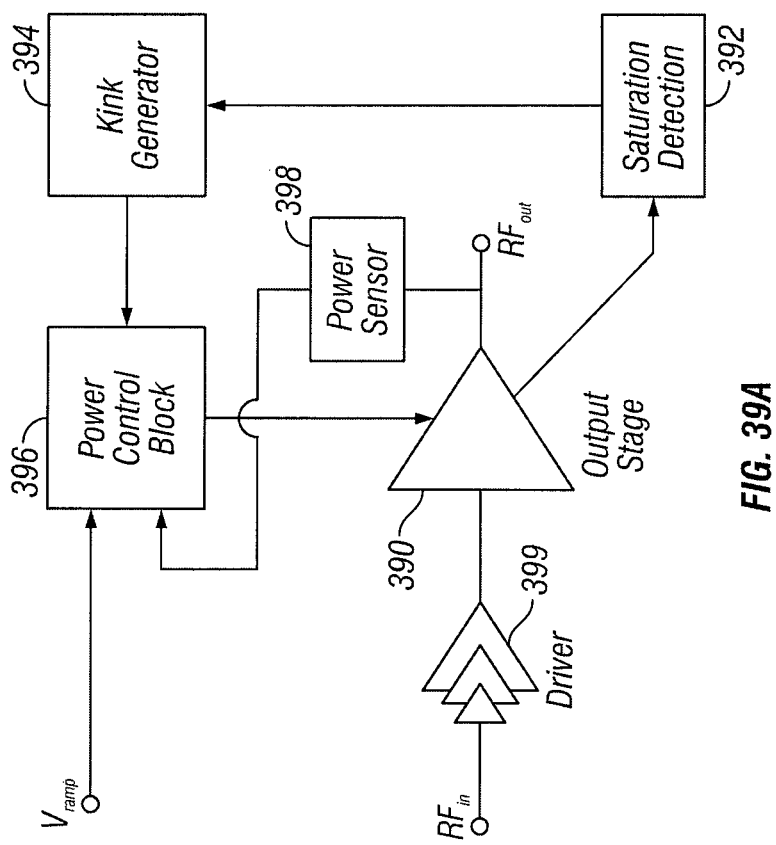
FIG. 39B
FIG. 39A

POWER AMPLIFIER WITH BACK-OFF EFFICIENCY

CROSS-REFERENCE TO RELATED APPLICATIONS

This application claims the benefit of U.S. Ser. No. 61/246,762 filed Sep. 29, 2009 and is related to U.S. Ser. No. 61/246,672, U.S. Ser. No. 61/246,740, U.S. Ser. No. 61/246,744, and U.S. Ser. No. 61/246,680, all filed on Sep. 29, 2009. All of the above-identified applications are fully incorporated herein by reference.

BACKGROUND

Power amplifiers are sized for peak efficiency at maximum power out. Maximum power out is defined by the specification. Efficiency is power out divided by DC power. DC power remains about the same through operation. Efficiency drops as a function of the output power. Therefore, a drop in output power of only few [dB] can result in about a 50% drop in efficiency, or even more.

FIG. 1(a) shows a typical power amplifier 10 top level diagram including a low noise input amplifier 18, one or more intermediary driver stages 16, the last driver 14, the high power output stage 12, biasing and miscellaneous circuits 19, and the output power level control circuit 100.

In power amplifiers 10 it is the last stage 12 that has the largest power dissipation, followed by the last driver stage 14. FIG. 1(b) shows a typical pie-chart of the total power dissipation and the contribution of each major power amplifier system building block. The power dissipation is by far dominated by the contribution of the last two stages 11 and 13 from the signal path. Therefore, any technique of improving the power amplifier system efficiency has two deal with these two last stages.

A typical plot of a power amplifier efficiency versus the output power level is shown in FIG. 2(a). The efficiency grows steeply in the last few [dB] of the output power level, reaching its peak value (PAE Max) at, or around the peak output power level (rated power level Pmax). However, if we analyze the amount of time that most power amplifier systems operate at the peak output level in a real-life communication application (e.g. GSM type wireless telephony), we may conclude that most of the time the power amplifier system operates away from the peak power level. FIG. 2(b) shows an example of the output signal probability density function, which gives the percentage of time the power amplifier system spends at each power level ranging from the minimum ($P_{min}$) to the maximum ($P_{max}$) level in a generic application. In many cases most of the time the power amplifier system operates around an average or median power ($P_{ave}$) which is several [dB] lower than the peak value.

Since the efficiency of traditional power amplifier systems drops very sharply from the peak value even for a few [dB] away (e.g. 10% of efficiency loss for each [dB] of lower power level), the effective efficiency of the power amplifier system in real life operation conditions is significantly lower than its peak efficiency value. As an example, if a traditional PA has a peak efficiency of 50% at peak power level, in real applications its "average" efficiency may be as low as 30% or even lower. This results in a much lower battery time, which is one of the most important customer metrics. Optimizing the power amplifier system performance for a larger battery time requires a power amplifier system with much higher efficiency at backed-off power levels. This is the main objective of this invention.

One established technique (Doherty PA) that is widely used in the discrete power amplifier systems and the semi-integrated power amplifier systems to achieve a better efficiency at backed-off power level is to use two or more power amplifiers that have their output combined such that at maximum output power level both (all) stages are active, while at lower power levels (one or more) stages are turned off to improve efficiency. At lower power level ($P_{backeoff}$) the efficiency achieves a second maximum since one power amplifier system stage is turned off and the other power amplifier system stage operates at peak power. Multiple maximums can be realized in the efficiency characteristic by combining more than 2 power amplifier system stages.

Another technique used in the past is power combining of several smaller size PAs. Such a technique needs transformers (baluns) or other hybrid components to perform the power combining.

The major drawback of the Doherty and power combining techniques is their poor integration level due to the needs of large-size transmission lines or transformers (baluns) to achieve the input signal splitting, and the output signal combining. The size constraint is very dramatic at lower operating frequency (e.g. 1 GHz). This prevents the full system integration and increases the size and cost.

By far the most popular power control technique for the saturated PAs is the drain or collector supply modulation using a constant feedback transfer. While this performs fine at peak output power levels, its efficiency performance at backed-off power levels is rather poor due to the large voltage drop and thus high power loss in the supply modulating device (regulator, DC-DC converter, or the like).

For the modern mobile battery operated transmitters and transceivers, such as cellular telephony handsets, it is very important to achieve a power amplifier that can provide the peak output power, while also ensuring a high efficiency at backed-off power levels, while all these features are achieved in a small footprint and at a low cost. A low cost and small size asks for a high level of integration, which cannot be realized with the existing PA technology.

It is the main object of this patent to describe a PA architecture and power control technique that is easy to integrate and which gives a high efficiency both at peak output power level and at backed-off power levels.

SUMMARY

An object of this invention is to provide a power amplifier system that has significantly higher efficiency at backed-off power levels and thus longer battery times, when compared with the traditional RF power amplifier system architectures.

Another object of the present invention is to provide a power amplifier that meets peak power level and efficiency at peak power specifications, while ensuring an improved back-off power level efficiency.

Yet another object of the present invention is to provide a power amplifier with improved average battery current consumption.

A further object of the present invention is to achieve enhancement of a power amplifier system efficiency using a power control technique that has control curves with inflection points at the locations where the power amplifier system experiences control compression.

Another of the present invention is to apply nonlinear power control curves to both drain (collector) and gate (base) power amplifier power control configurations.

Yet another object of this invention is to provide automatic alignment of control curve inflection points with power amplifier system compression points using different types of saturation detectors.

Yet another object of the present invention is to provide power amplifiers that use voltage-mode or current-mode and RF or baseband saturation detectors.

A further object of the present invention is to provide power amplifiers with nonlinear control compensation using characteristics with multiple inflection points, or using multiple characteristics with one or multiple inflection points.

These and other objects of the present invention are achieved in, a power amplifier system is provided with a signal path including driver stages and output stages. A power control element has one or more control ports and uses one or more nonlinear control characteristics.

In another embodiment, a power amplifier system is provided with a signal path including driver stages and an output stage. A power control element is coupled to the signal path.

DRAWINGS

FIGS. 1(a) and (b) are graphs of typical prior art power amplifier efficiency variation with the output power level and output signal power probability density function.

FIGS. 2(a) and (b) illustrate prior art power amplifier signal paths and a pie chart showing possible contributions at the different stages to the overall power dissipation.

FIG. 3(a) through (b) illustrate improved power amplifier efficient at back-off power levels in one embodiment of the present invention.

FIGS. 4(a) and (b) illustrate output power control using peak amplitude variation and using duty cycle variation in one embodiment of the present invention.

FIGS. 5(a) through (c) illustrate combining amplitude modulation with pulse width modulation to achieve higher efficient of backed-off power levels with low, moderate and high powers in one embodiment of the present invention.

FIGS. 6(a) and (b) illustrate pulse width modulation through the bias voltage of a non-linear function in a schematic and also the transfer characteristic, in one embodiment of the present invention.

FIGS. 7(a) and (b) are schematic diagrams illustrating combining amplitude peak modulation with pulse-width modulation in saturated power amplifiers using the same power amplifier port and using different power amplifier control ports, in one embodiment of the present invention.

FIGS. 8(a) through (c) illustrate amplitude and pulse with modulation applied to bias voltages, (a) with bias voltage and current, and (b) with bias currents, in one embodiment of the present invention.

FIGS. 9(a) and (b) illustrate power control techniques in open and closed loops, in one embodiment of the present invention.

FIGS. 10(a) and (b) illustrate power amplifier control curve non-linearity compensation with, non-compensated power amplifiers, and by adding compensation control curve generators, in one embodiment of the present invention.

FIGS. 11(a) and (b) illustrate a power amplifier power control loop seen as a feedback system in one embodiment of the present invention.

FIGS. 12(a) and (b) illustrates methods of approximating the non-linear power amplifier control curve and associated power control curves, in one embodiment of the present invention.

FIGS. 13(a) through (c) are schematic diagrams illustrating ways of generating non-linear control curves to compensate for power amplifier compression with a kink generator, a multi segment PWL and with a continues non-linear curve, in one embodiment of the present invention.

FIGS. 14(a) and (b) illustrate a conventional saturated driver/saturated output stage in a power amplifier architecture versus linear to saturated driver/linear to saturated output stage power amplifier architectures, in one embodiment of the present invention.

FIGS. 15(a) and (b) are schematic diagrams illustrating extrinsic versus intrinsic non-linearity generation for the control curves, in one embodiment of the present invention.

FIGS. 16(a) and (b) illustrate a power amplifier and graph using an output voltage (power) dependent control curve with a programmable (adjustable) kink point, in one embodiment of the present invention.

FIGS. 17(a) and (b) illustrate non-linear control curve generation for DC compiled driver to output stage connection, in one embodiment of the present invention.

FIGS. 18(a) and (b) are curves illustrating power control having multiple kinks in the control characters with a single control curve with multiple kinks, and multiple control curves with a single kink, in one embodiment of the present invention.

FIGS. 19(a) and (b) are schematic diagrams of a power amplifier using gate power control with multiple control points, each having its own kink point with, only gate control and gate and drain control, in one embodiment of the present invention.

FIG. 20 is a schematic diagram of a multi cascode output stage using dual gate thickness FETs, in one embodiment of the present invention.

FIGS. 21(a) through (c) are schematic diagrams illustrating hybrid LV-HV cascode power amplifier output stages with, a single HV cascode, all HV cascodes, and both LV and HV cascodes, in one embodiment of the present invention.

FIGS. 22(a) and (b) are schematic diagrams of output stage cascode configurations using more than two gate thickness FETs, in one embodiment of the present invention.

FIGS. 23(a) through (c) are schematic diagrams of a single ended cascode stage with, a differential cascode stage, and a quadrature cascode stage, in one embodiment of the present invention.

FIGS. 29(a) and (b) illustrate power control with intrinsically generated non-linear curves, in one embodiment of the present invention.

FIGS. 30(a) and (b) illustrate mixing a non-linear control curve with non-power dependent nonlinearity for optimized power amplifier performance over design corners, in one embodiment of the present invention.

Figure 31B:
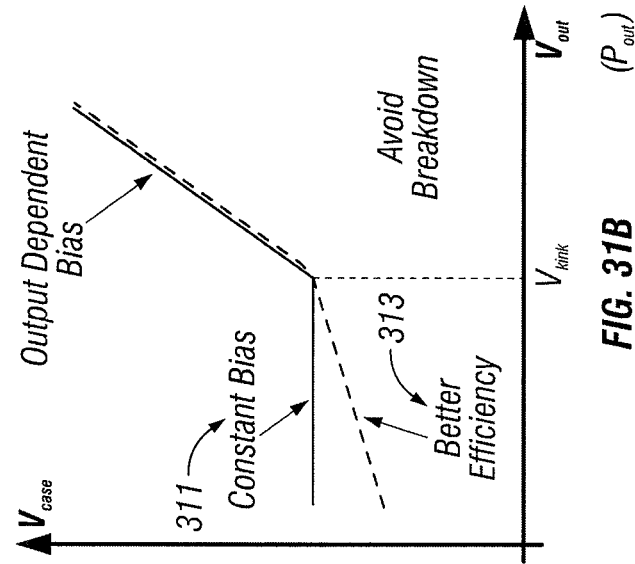
Figure 31A:
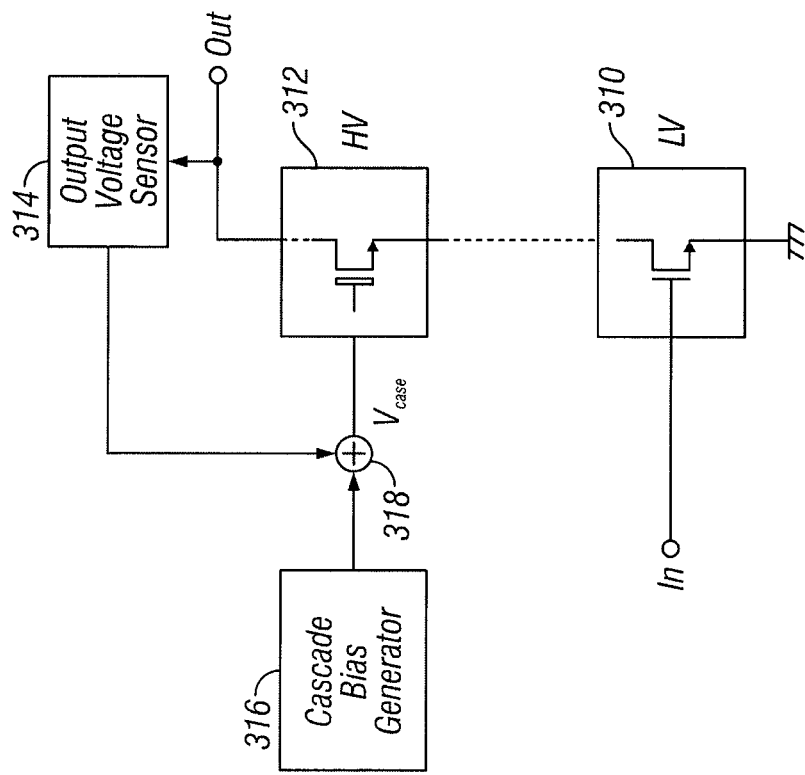

FIGS. 31(a) and (b) illustrate a power amplifier using an output voltage (power) dependent cascode bias architecture for breakdown relief, in one embodiment of the present invention.

Figure 32:
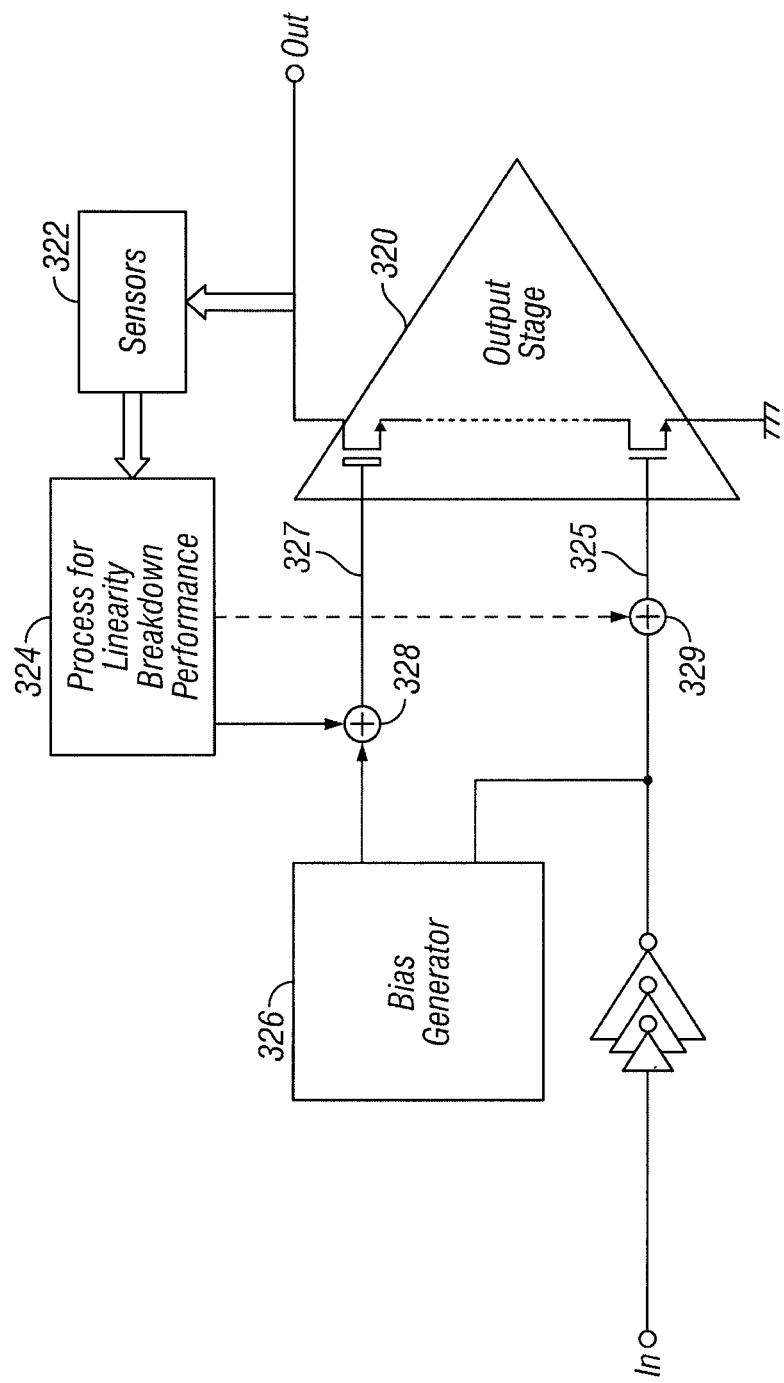

FIG. 32 is a schematic diagram of a power amplifier using adjustable bias for linearity enhancement and/or breakdown avoidance and/or efficiency improvement, in one embodiment of the present invention.

Figure 33:
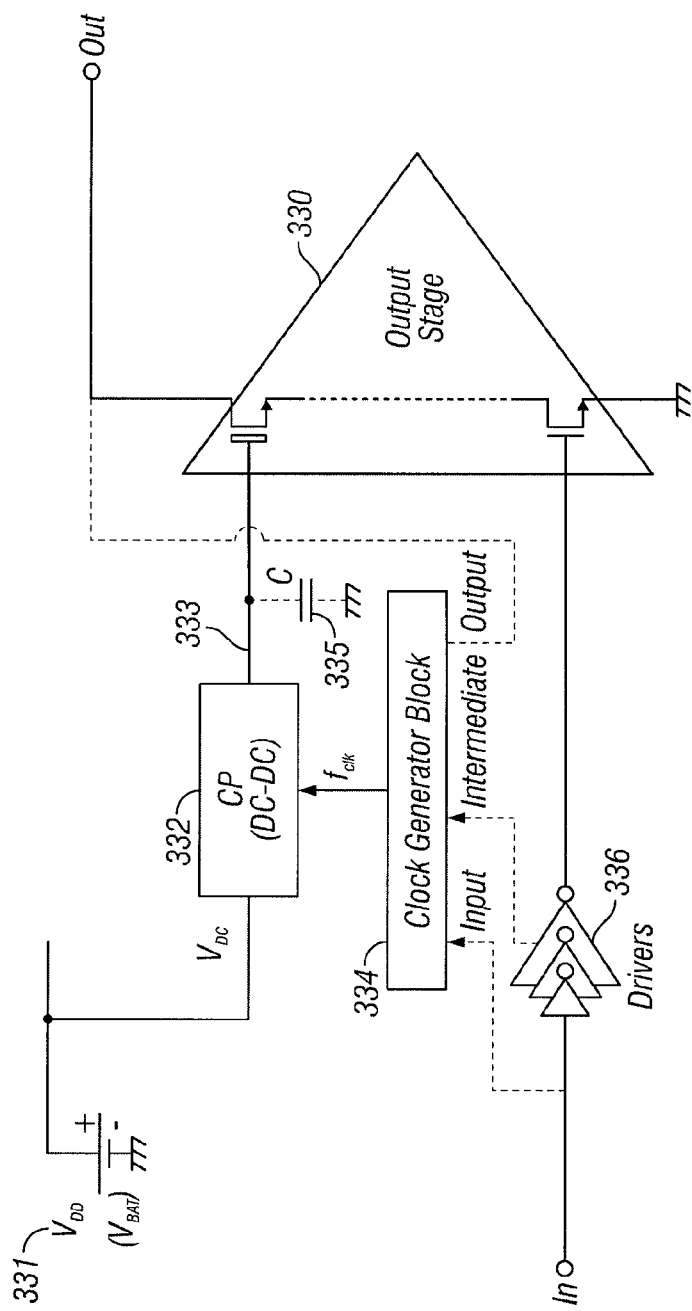

FIG. 33 is a schematic diagram illustrating a charge-pump DC-DC converter for biasing the cascode gate of a power amplifier output stage, in one embodiment of the present invention.

Figure 34:
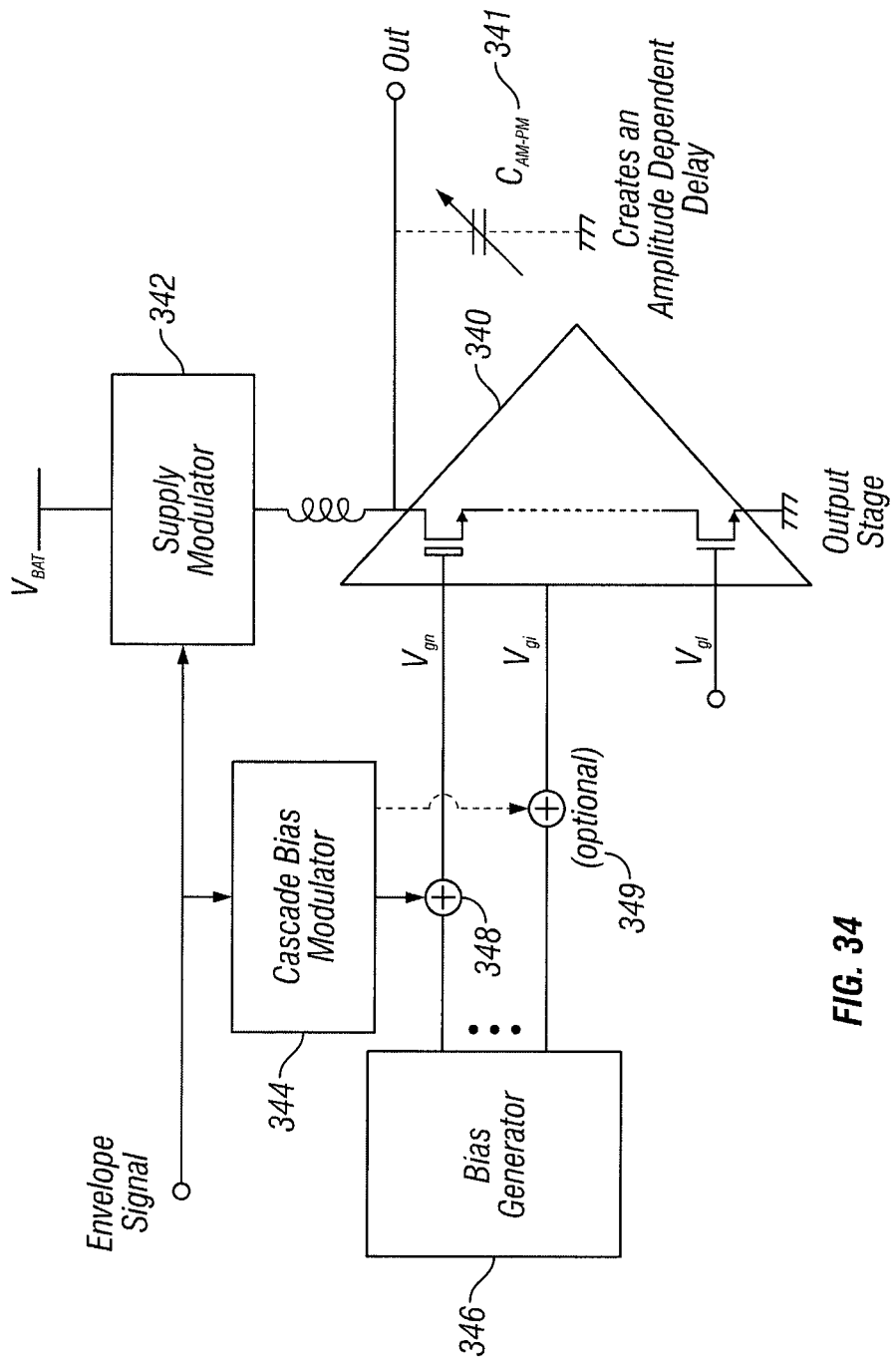

FIG. 34 is a schematic diagram of a power amplifier output stage using cascode bias modulation to modulate the nonlinear output capacitance and thus improve the overall AH-PH distribution, in one embodiment of the present invention.

Figure 35:
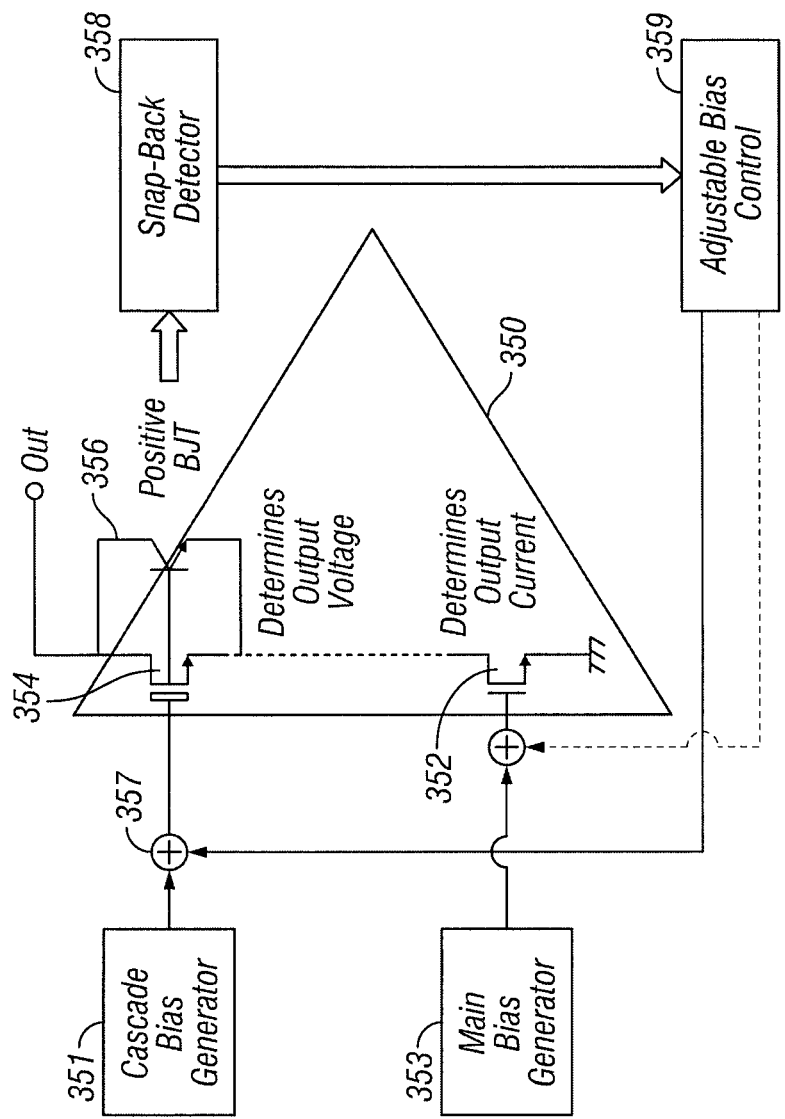

FIG. 35 is a schematic diagram of a power amplifier using a cascode output stage with variable bias to avoid a snapback effect, in one embodiment of the present invention.

Figure 36:
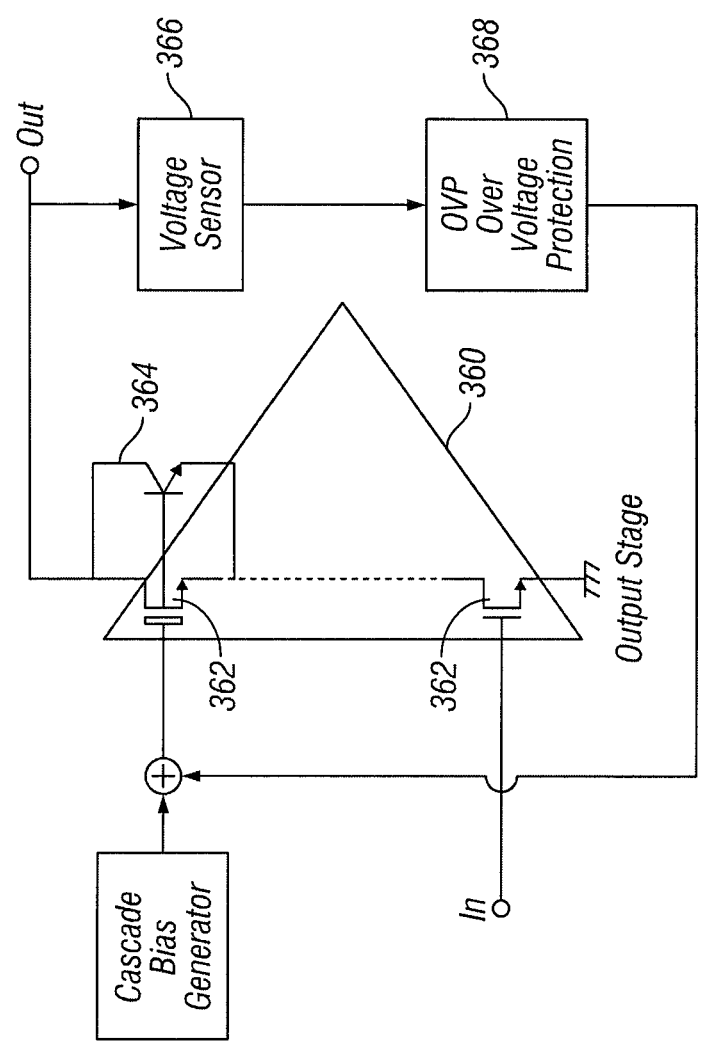

FIG. 36 is a schematic diagram of a power amplifier cascode output stage using voltage sensing and over-voltage protection for snapback avoidance, in one embodiment of the present invention.

Figure 37B:
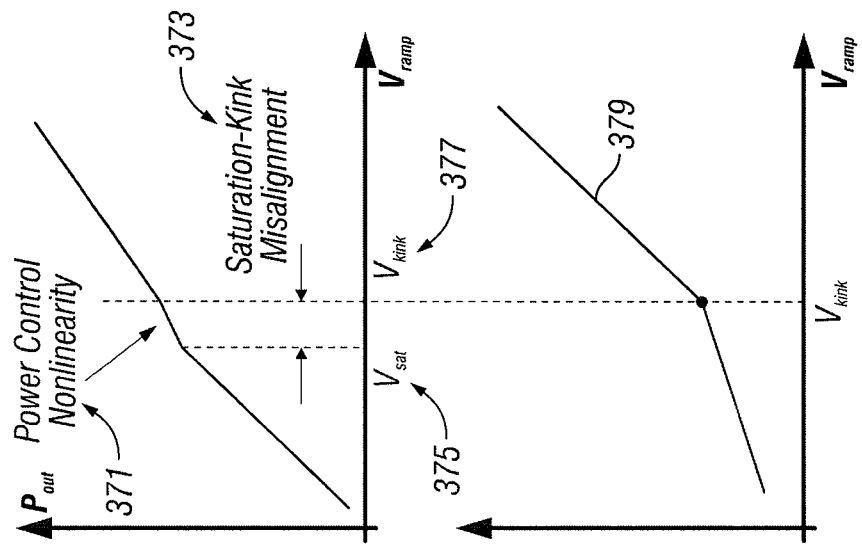
Figure 37A:
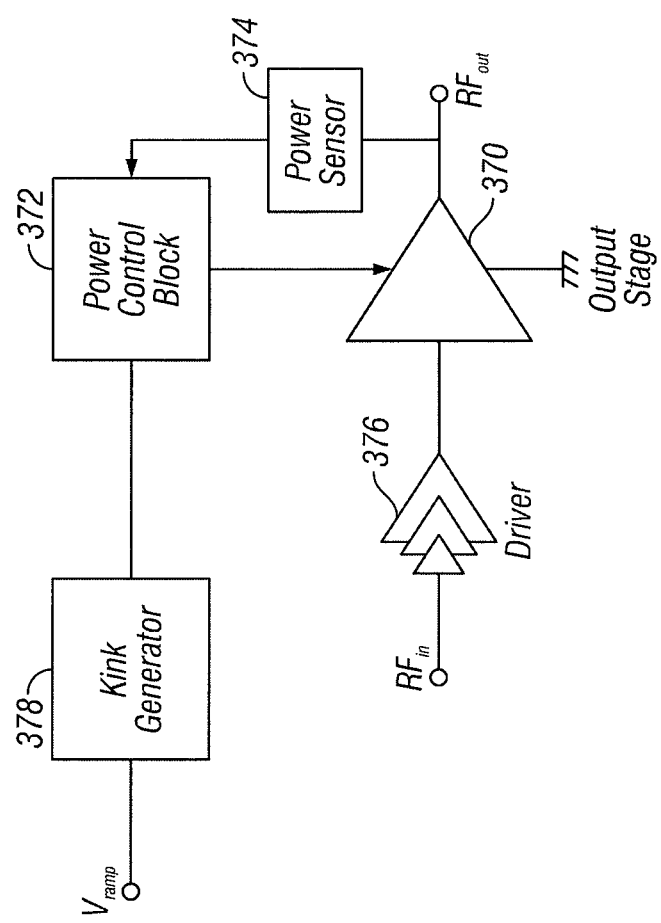

FIGS. 37(a) and (b) illustrate open-loop power amplifier control with kink at prescribed Vramp voltage and around the point where the output stage enters a hard saturation, in one embodiment of the present invention.

Figures 38A, 38B:
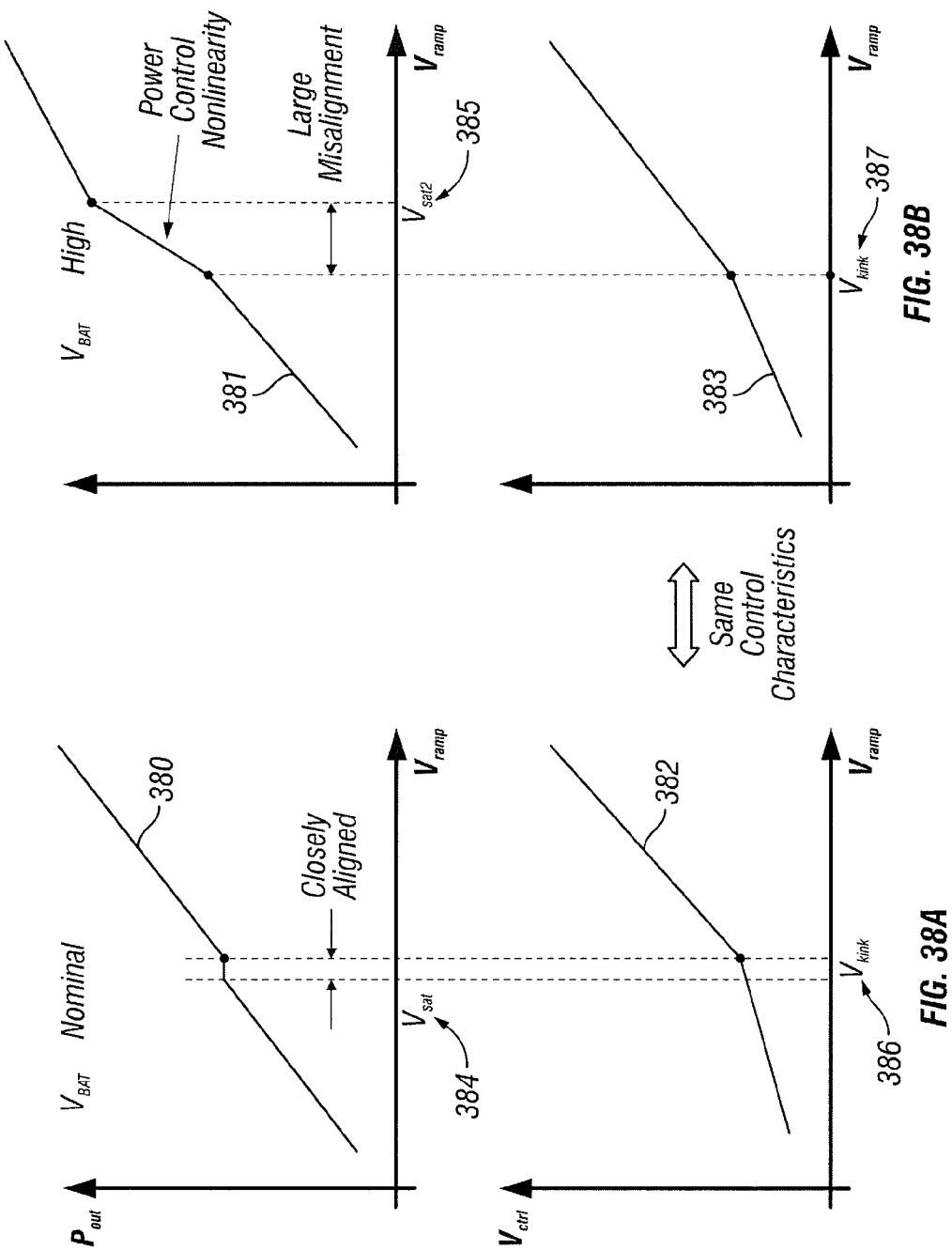

FIGS. 38(a) and (b) illustrate supply dependence of power amplifier saturation and its impact on the central kink alignment, in one embodiment of the present invention.

FIGS. 39(a) and (b) illustrated a closed loop power amplifier power control architecture with automatic kink alignment through saturation detection, in one embodiment of the present invention.

Figures 40A, 40B, 40C:
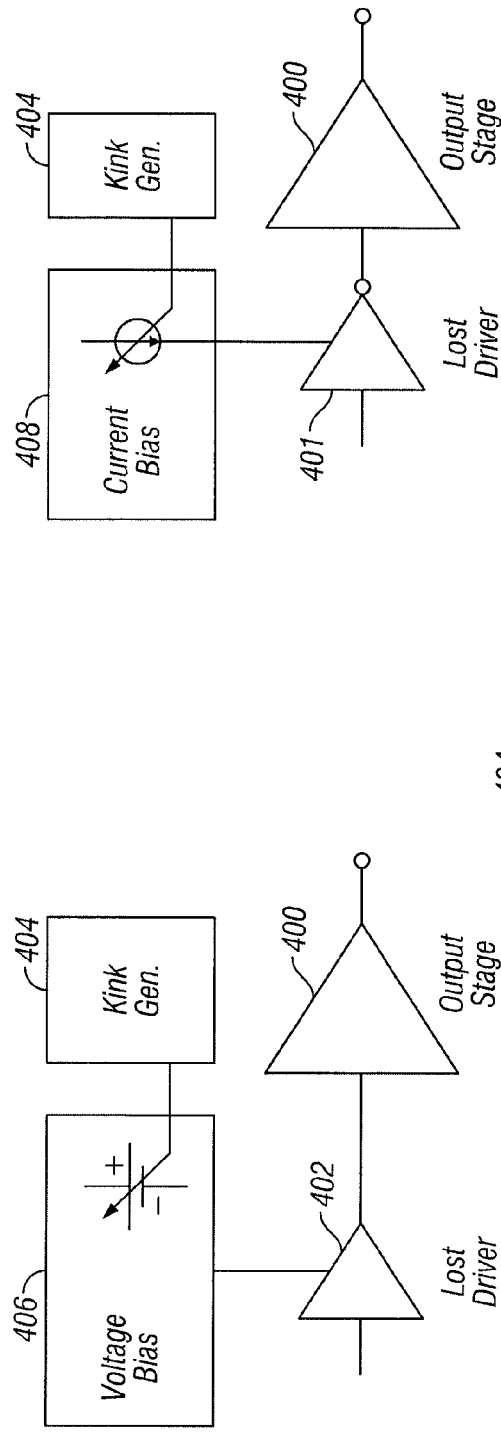

FIGS. 40(a) through (c) illustrate control characteristics of a combined drain (main) and gate (auxiliary) power control scheme showing the drain and gate control voltages (a) and the efficiency characteristics for the classical and the kink control curve (b), in one embodiment of the present invention.

Figure 41:
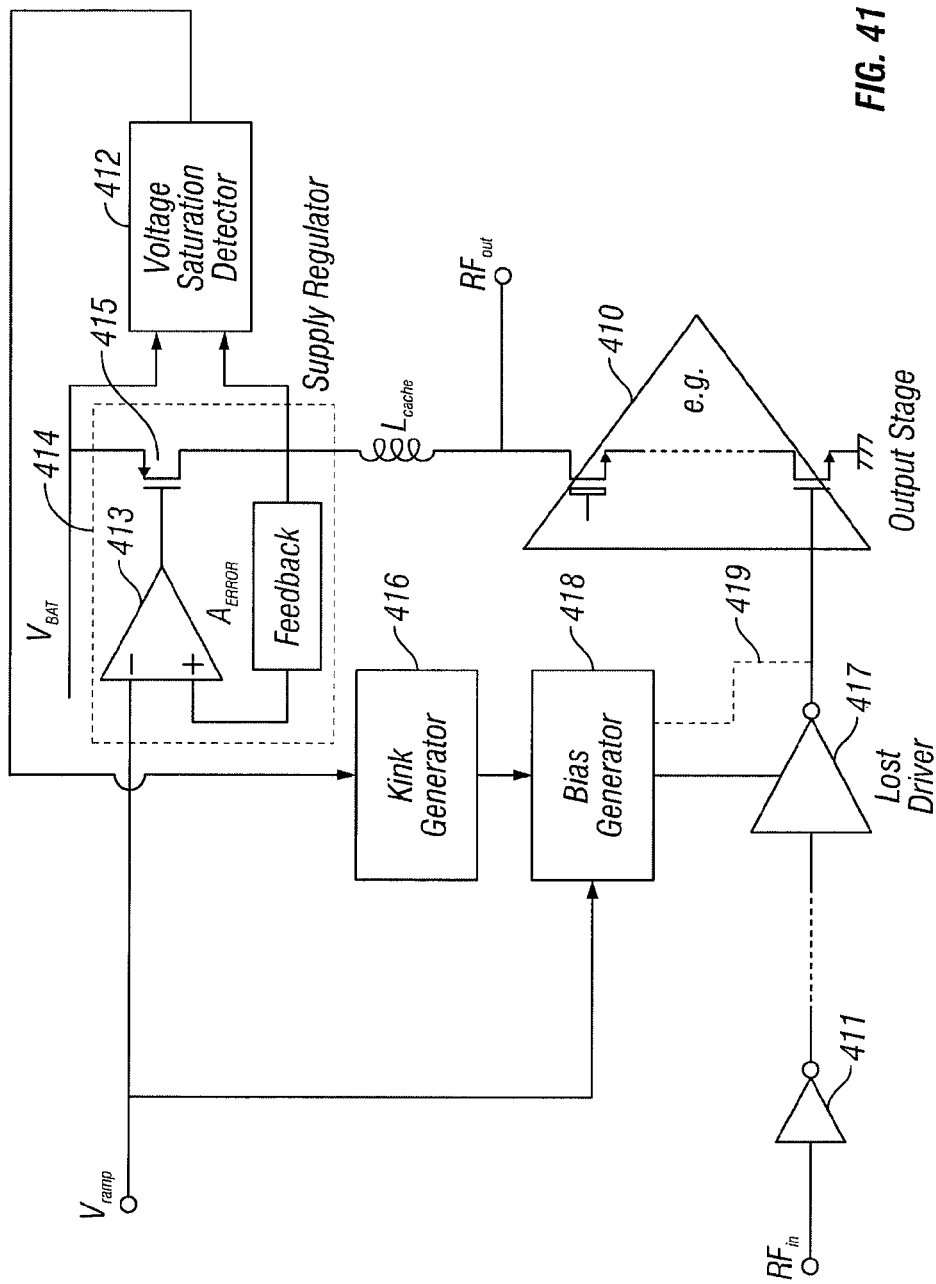

FIG. 41 is a schematic diagram illustrating power control with inflection points using a drain main power control scheme, a voltage mode saturation detection and a driver bias kink generation, in one embodiment of the present invention.

Figure 42A:
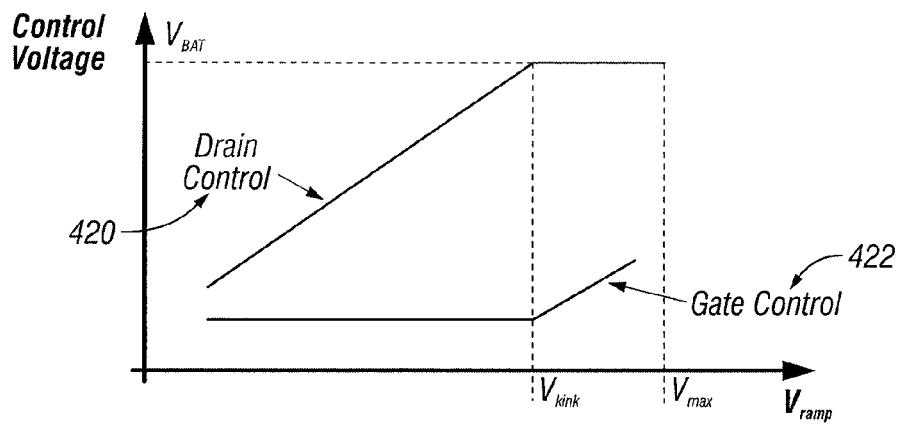
Figure 42B:
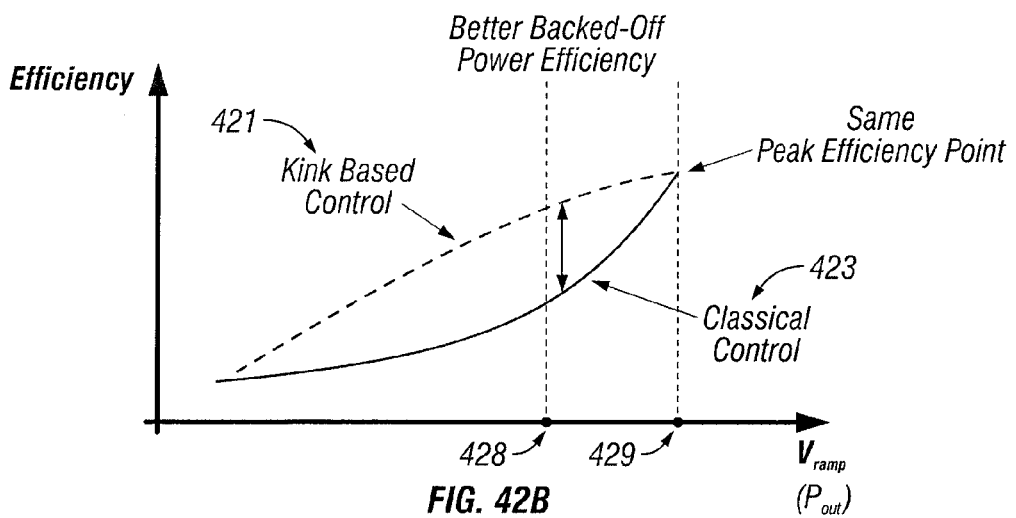

FIG. 42 illustrates the control characteristics of a combined drain (main) and gate (auxiliary) power control scheme showing the drain and gate control voltages (a) and the efficiency characteristics for the classical and the kink control curve (b), in one embodiment of the present invention.

Figure 43:
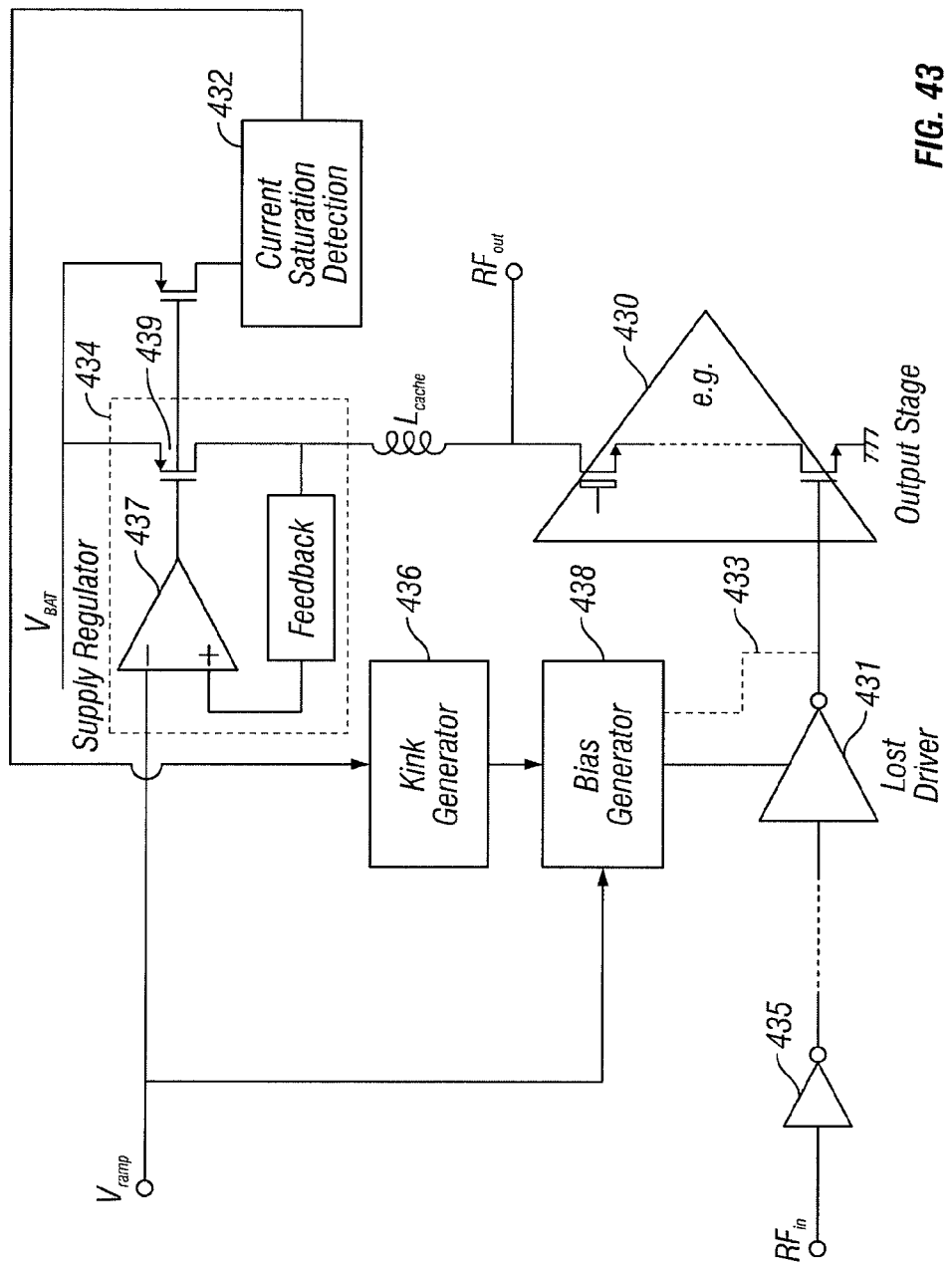

FIG. 43 is a schematic diagram for current-mode saturation detection using drain main power control, a current mode saturation detection and a driver bias generation, in one embodiment of the present invention.

Figure 44:
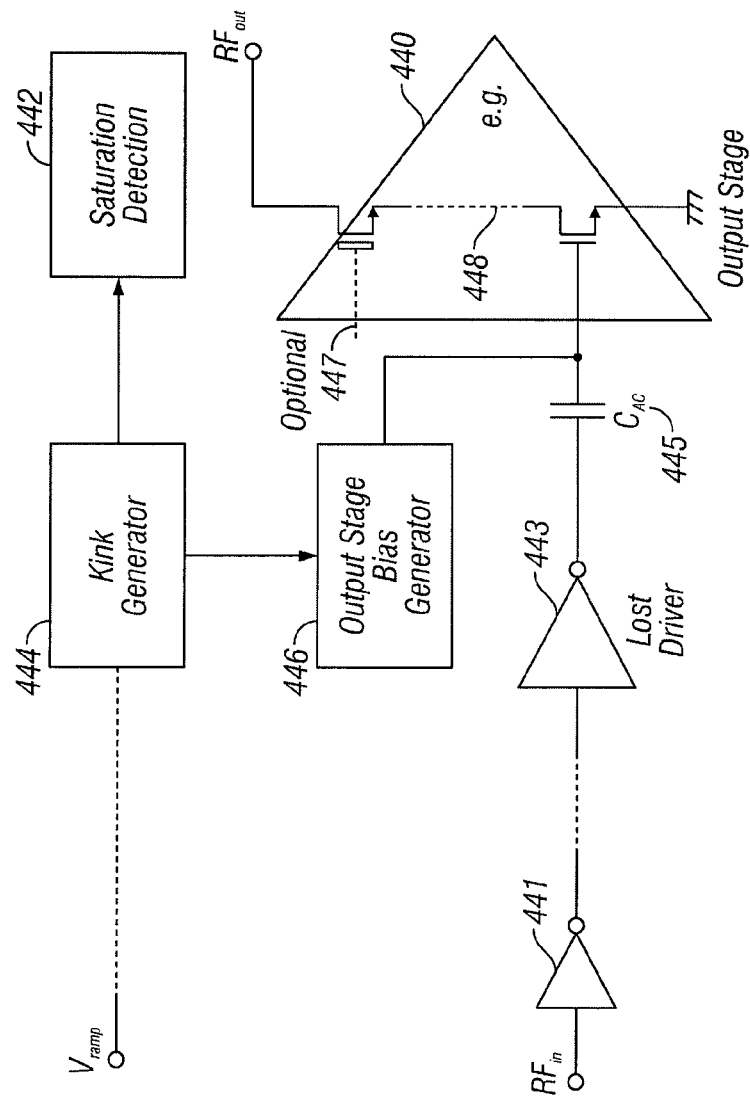

FIG. 44 is a schematic diagram illustrating the kink control curve technique for AC coupled driver and output stages, in one embodiment of the present invention.

Figure 45:
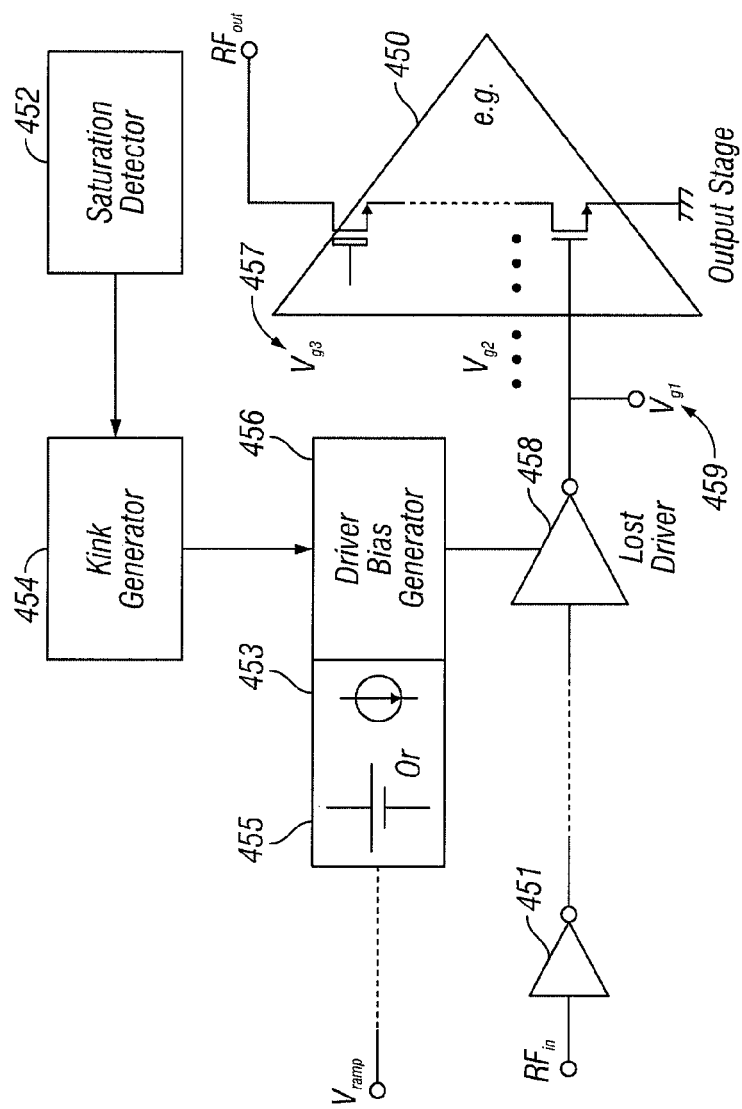

FIG. 45 is a schematic diagram of a kink control curve technique for DC coupled driver and output stages, applicable for both voltage-mode and current-mode driver bias, in one embodiment of the present invention.

Figure 46:
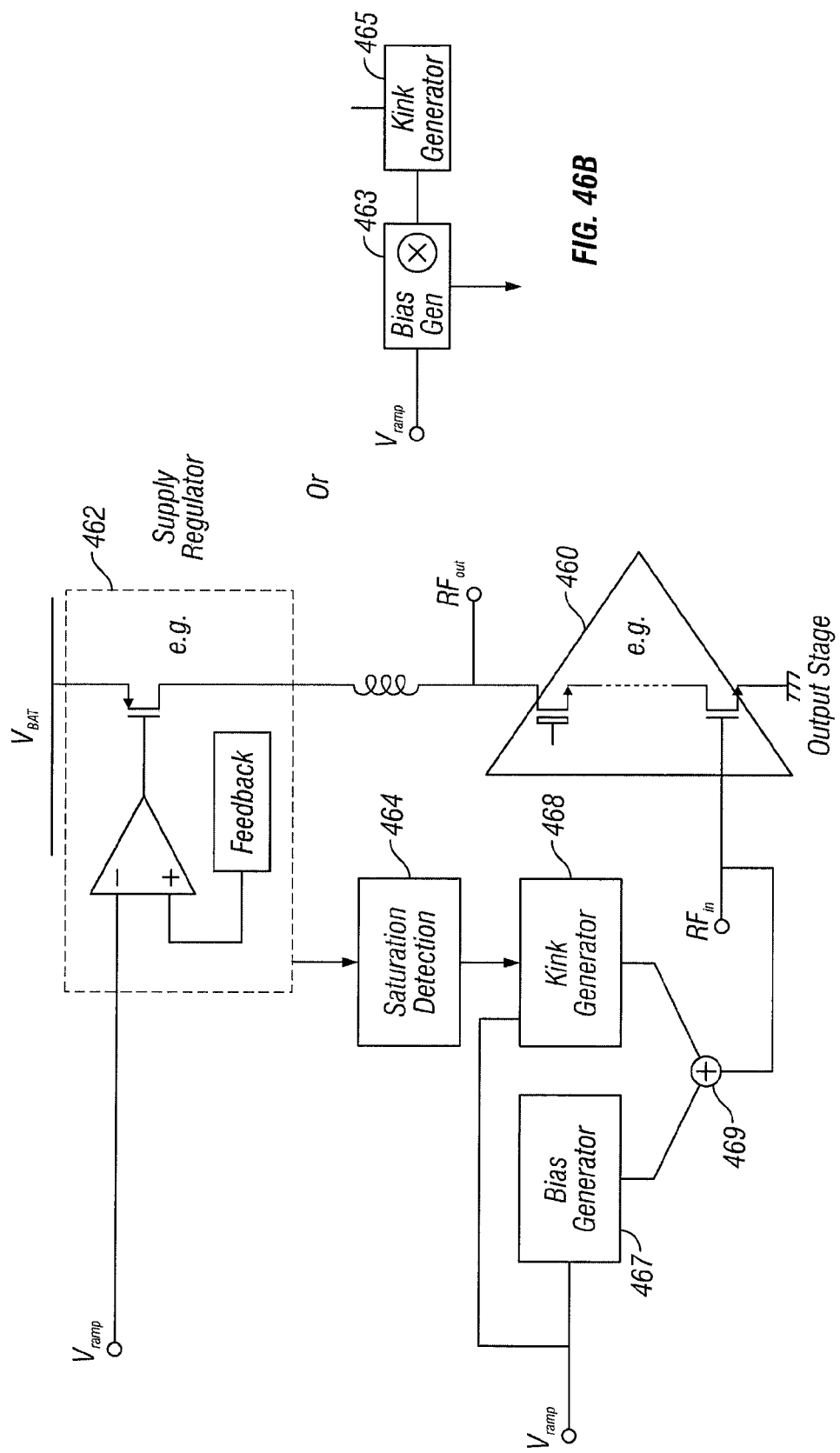

FIG. 46 is a schematic diagram using the hybrid drain (main) and gate (artillery) power control with the kink generated in a closed loop driven by an output saturation detector, in one embodiment of the present invention.

Figure 47:
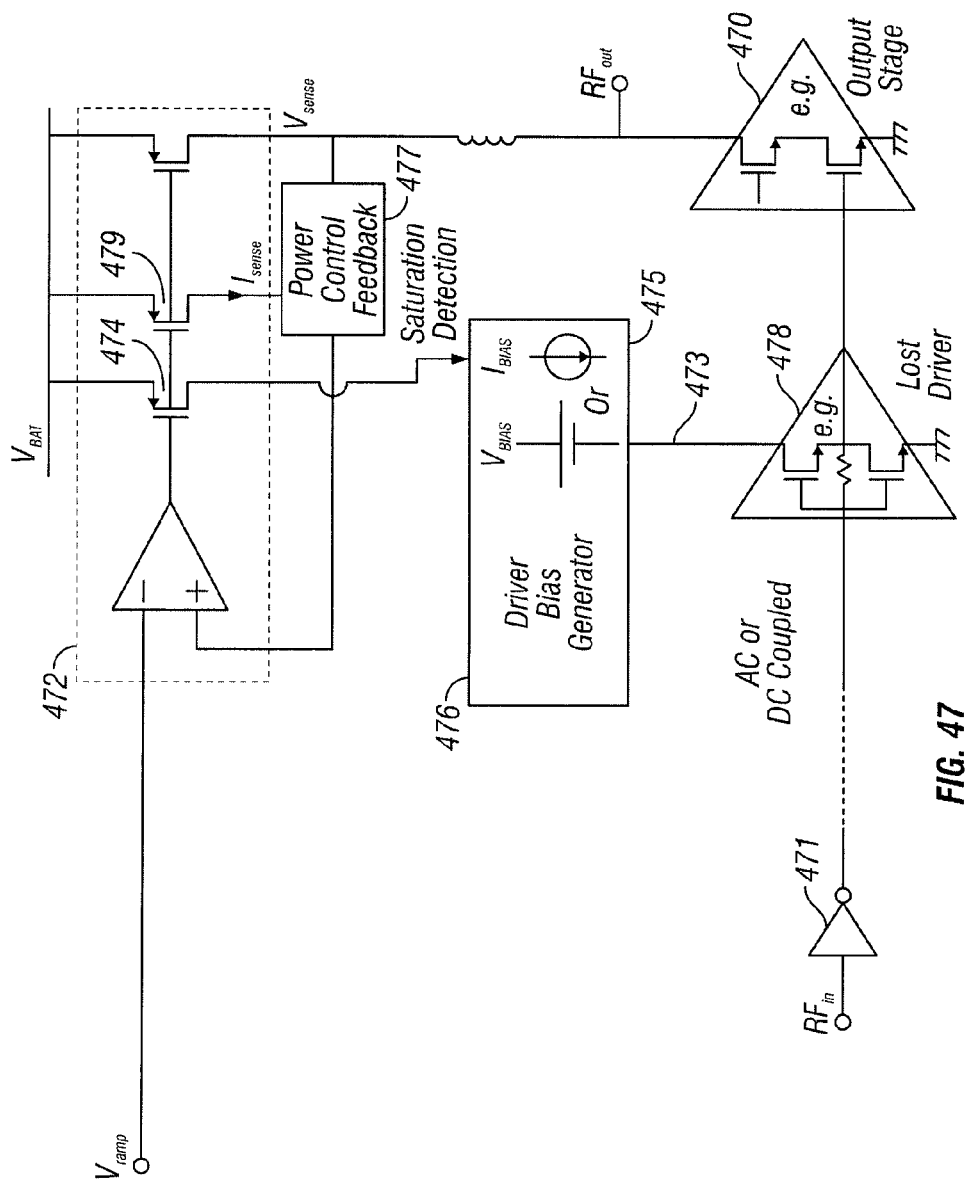

FIG. 47 is a schematic diagram illustrating a CMOS power amplifier system having a cascode output stage with a drain supply regulator and a current-mode saturation detector, in one embodiment of the present invention.

Figure 48:
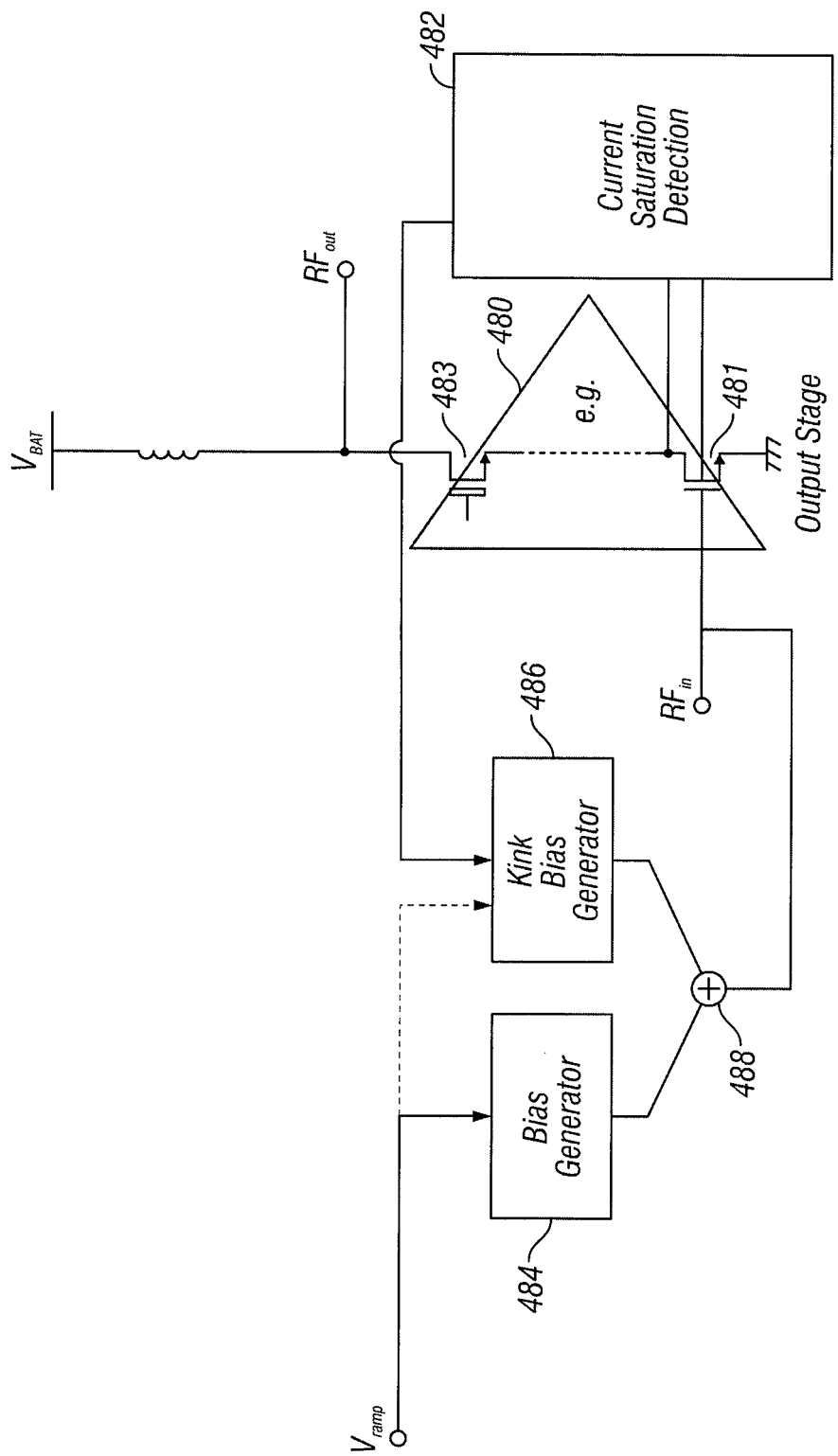

FIG. 48 is a schematic diagram of a CMOS power amplifier system having a cascode output stage with gate power control and bias voltage generation based on an RF saturation detector, in one embodiment of the present invention.

DETAILED DESCRIPTION

In one embodiment, the present invention provides a power amplifier system 10 that provides, (i) improved back-off efficiency while meeting peak power requirements, (II) meets peak power with improved back-off efficiency, (iii) has a more linear overall power control characteristic with no major compression or inflection points, and (iv) has decreased power consumption resulting in an improvement in average battery consumption. This is achieved by using a power control technique having nonlinear control characteristics that tend to compensate the intrinsic nonlinearity of the power amplifier control transfer characteristic. In one embodiment, talk time for a given battery is improved by as much as 25 to 50%.

Figures 1A, 1B:
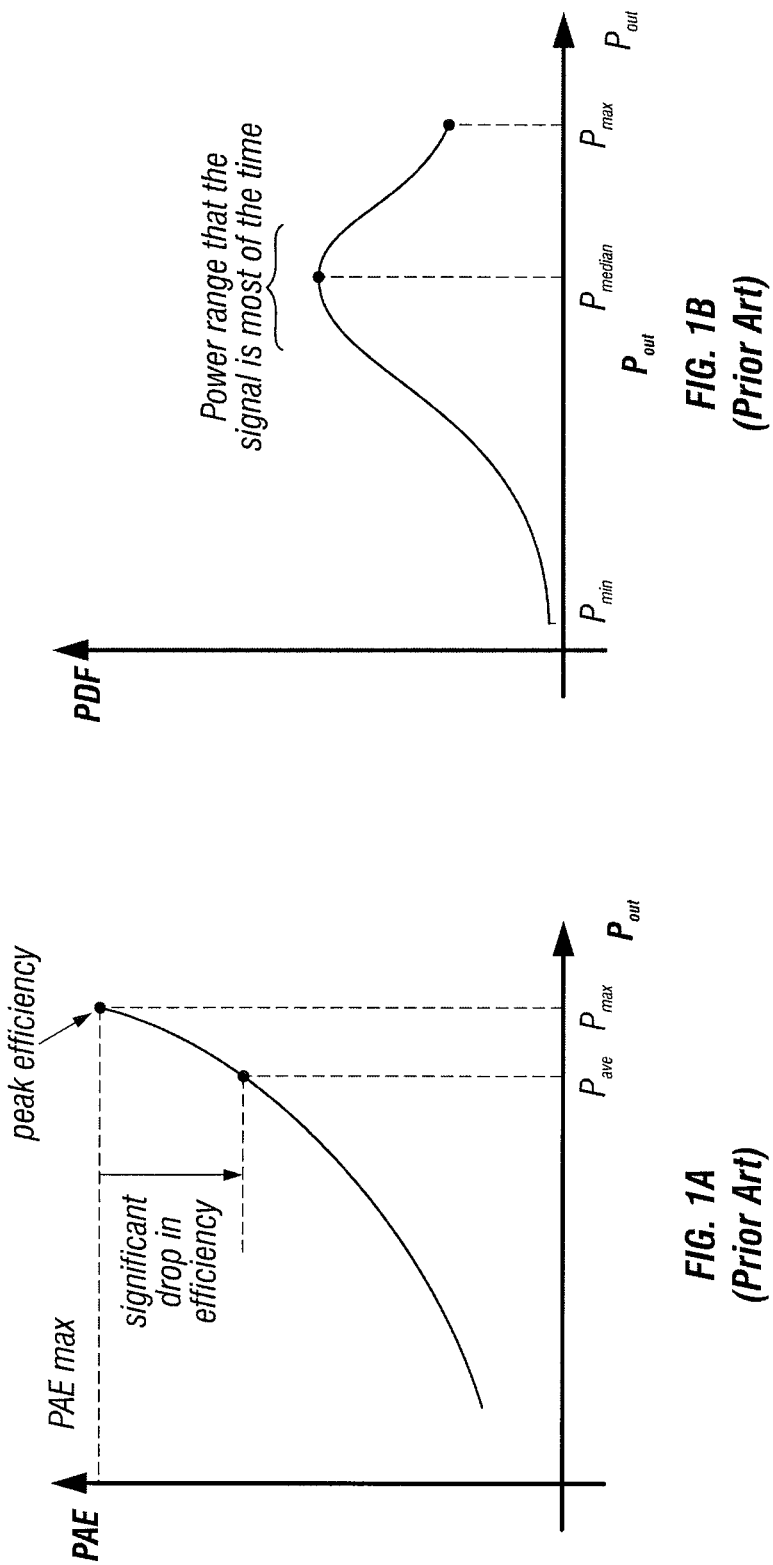
Figure 2B:
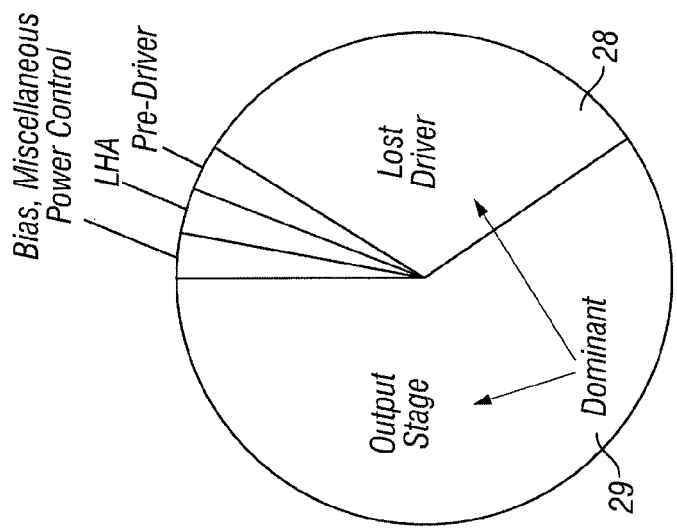
Figure 2A:
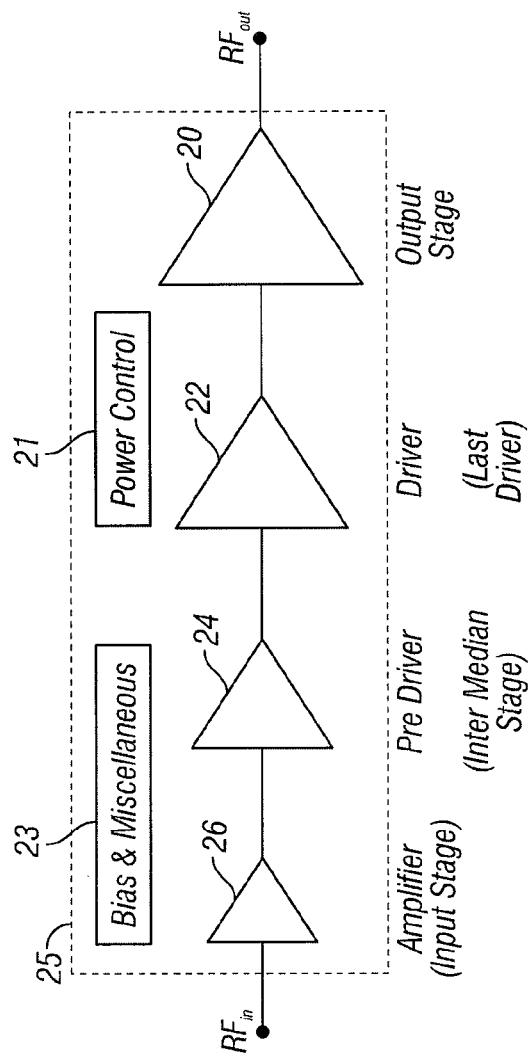
Figure 3A:
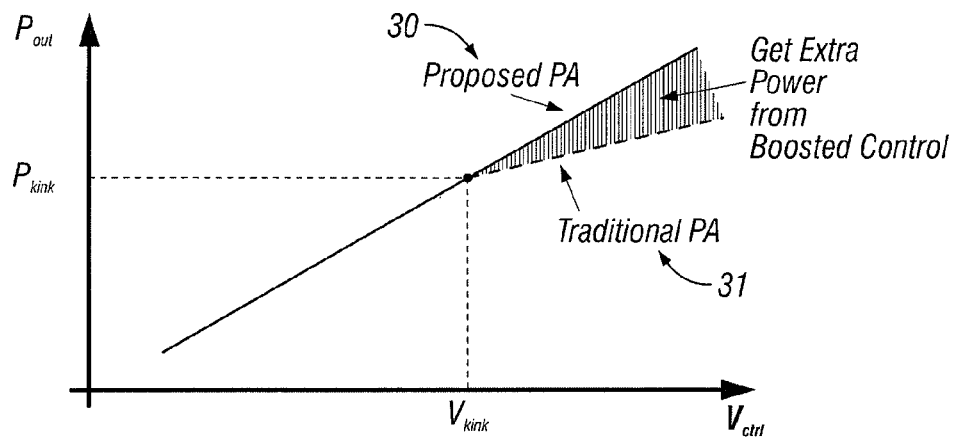

FIG. 3(a) shows the top level block diagram of the power amplifier system using nonlinear control curves technique. The power amplifier system 10 of the present invention includes multiple driver stages 31, 33, 35. The last driver stages 31 can be either AC or DC coupled to the output stage 30. With the present invention, most of the activity relating to improved back-off efficiency is achieved in the last two stages 31 and 30, where the highest power is consumed.

The nonlinear control curves aimed at compensating the intrinsic nonlinear control characteristic of the power amplifier can be applied to one or multiple control points 39 from the power amplifier signal path, as shown in FIG. 3(a) This may include last driver 31 bias voltages or currents, output stage 30 gate and/or cascade voltages and even intermediary drivers 35 bias voltages and/or currents.

This invention applies to all existing power amplifier power control schemes, including: the drain (collector) power control, the gate (base) power control and any combination of the two as presented in U.S. Ser. No. 61/246,672 filed on Sep. 29, 2009 and included as a reference to this application.

The power amplifier system 10 of the present invention allows operation more in line with the probability density function of the cell phone system, e.g, the time percentage of operation at a lower than peak power level is larger than the percentage of time spent at peak output power. By ensuring a higher efficiency at backed-off power levels where the power amplifier spends most of the time, the average efficiency and the battery in real-life applications is largely improved. For cell phone applications, each cell phone communicates with one base station at a time with base station selection and cell phone power under base station control. Traveling within a cell coverage area, the most likely transmit power levels are in the middle range. Thus ensuring a high efficiency at power levels in the middle of the output power range (i.e. at backed-off power levels from the peak value) is critical to extend talk time on a single battery charge.

In the case of drain power control technique, the system of the present invention minimally biases the later output stages 30 and 31 and allows the drain bias to approach the battery voltage ($V_{battery}$). In this case, power is not wasted in the regulator at peak output power levels. The power amplifier system 10 of the present invention varies the conduction angle, as shown later in FIGS. 4(a) and (b). The bias of the output stage is changed in a continuous way and so increases the output power beyond the point where the regulator for the drain bias saturates to the battery voltage. The output power changes smoothly versus the input power control signal ($V_{ramp}$).

When the amplifier system of the present invention is a drain bias amplifier, it senses the drain approaching the battery voltage using a saturation detector and runs the amplifier as efficiently as possible. The amplifier system can detect the saturation point of the drain voltage as it reaches $V_{battery}$. The saturation point can be detected automatically, non-automatically or with a fixed curve. It then provides for a continuous (smooth) increase in gate bias voltage. This means that the operation of the amplifier system automatically tracks $V_{battery}$. The smooth increase can be achieved by an automatic alignment that increases the bias voltage of the gate to the saturation of the drain bias. Saturation can also be determined by detecting the minimum drain voltage on the main transistor of the output stage. In one embodiment, a large cascoded output transistor is provided. The present invention is particularly suitable for CMOS. It can also be utilized with, bipolar, HBT. MESFET, GaAs, InP, SiGE, Bi-CMOS, BCD, and can also be implemented in other technologies.

In another embodiment, the drain bias amplifier stops at a certain threshold, and the gate bias starts when the other one stops. A stop at the threshold is programmed in and the gate bias increases. Such a hybrid drain and gate power control technique results in an extended power control range, as presented in U.S. Ser. No. 61/246,672 filed on Sep. 29, 2009 and included as a reference to this application.

The power amplifier system can be used with a cell phone with a regulator that has $V_{battery}$ in the cell phone. For a saturated amplifier, the RF power is about proportional to the square of the power supply voltage on the output stage. A signal $V_{ramp}$ is associated with the regulator. The power out is proportional to the square of Vramp. $V_{ramp}$ is a controlled signal input to the power amplifier.

In one embodiment, the present invention maintains an efficiency of the output stage at higher than 50% at the peak power. At lower backed-off power, the conduction phase may be as low as 20% or even less. As the power increases, the present invention provides a low conduction angle, with just enough amplitude to drive the output stage. The voltage swing at the output depends on the regulator voltage. That voltage must be selected to be higher for a smaller conduction angle to transmit the same power. Because the transmit power depends on the product of current and voltage, more voltage works with less current from the battery to produce the desired backed-off power. In one embodiment, the system of the present invention controls the output power by controlling the $V_{drain}$ bias. As $V_{drain}$ approaches the battery $V_{battery}$, the greatest efficiency is achieved. Any power condition which requires the regulator to drop part of the battery voltage at the drain of the power stage dissipates at least a portion of the available power not as transmitted power. At baked-off power levels the power wasted on the regulator can be 50% or even more of the DC power taken from the battery (supply voltage). As the regulator voltage approaches $V_{battery}$, the regulator loss approaches 0. As soon as it approaches the $V_{battery}$ (within one saturation voltage from the supply) the regulator clips and the power can no longer be changed through the drain control.

However, more power is desired and the system of the present invention continues to drive it. At this point, the system of the present invention senses that $V_{battery}$ has clipped into the voltage rail, the drain bias, and then is only able to go up to the level of $V_{battery}$. The system of the present invention senses this limitation by using some form of saturation detector (e.g. voltage or current saturation detectors), and sums into the control voltages and changes the gate bias of the last stage. The result is that the DC bias of the sine wave changes and so the conduction angle changes. As such the class of operation for the output stage may change from deep-class.

With the system of the present invention, if the transistor is on for a longer period of time then more power is produced at the system output In one embodiment, the system of the present invention clips into the rail earlier than a standard drain power controlled power amplifier, and thus a higher efficiency is achieved at a lower output power level (e.g. several [dB] below the peak output power level).

By using the conduction angle (i.e. pulse width modulation) in the output stage the drain bias goes into the battery sooner. Therefore, the power amplifier will achieve a better efficiency at lower than peak power levels.

For the majority of applications where the power amplifier is operated at lower than peak power, the efficiency can be much better, and an increase of 20% to 40% in battery life can be achieved. Because the operation of the present invention at the peak output power is not modified, there is essentially no sacrifice in peak efficiency, when getting the improved efficiency at backed-off power levels. Thus, the present invention increases battery life while the peak power and efficiency are competitive with other solutions and devices.

In a non-drain bias amplifier system embodiment, such as for example the gate power control, the same method of achieving better efficiency at backed-off power levels can be used, except the output stage is run first linearly and later-on in saturation.

It will be appreciated that the present invention also works over VSWR, temperature and other conditions including, but not limited to battery variation, power control level and manufacturing tolerance.

In one embodiment the power amplifier system 10 of the present invention achieves a power amplifier architecture that has much better efficiency at lower power levels. This was done by compensating the nonlinear (compressed) control characteristic of a typical power amplifier system 10, as shown with dotted line in the FIG. 3(b) upper side.

There are several ways of controlling the output power level of a saturated power amplifier, i.e. operating with constant antelope signals, including but not limited to: drain (collector) control, gate (base) control, and a combination of drain and gate control as presented in U.S. Ser. No. 61/246,672 filed on Sep. 29, 2009 and included as a reference to this application.

Figure 3B:
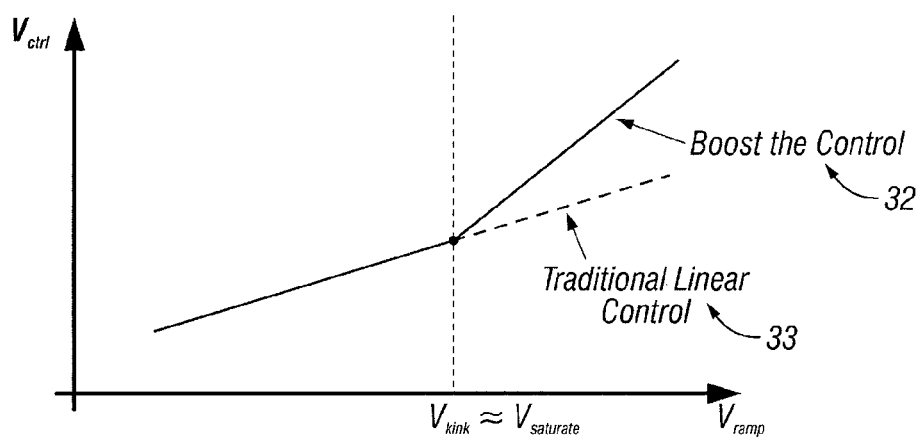

We denote by $V_{ctrl}$ the signal at the power amplifier power control port. If multiple control ports exist, than the control characteristics will be multi-variable functions. A similar behavior can be achieved as described below. If a linear $V_{ctrl}(V_{ramp}=P_{target})$ characteristic is used, as shown in the FIG. 3(b) lower side with dotted line, then the $P_{out}(V_{ramp})$ overall control curve will have a change in slope around the point where the amplifier enters in hard saturation, as shown in FIG. 3(b) upper side with dotted line. Avoiding such a compression in the overall power amplifier control characteristic needs a higher control signal variation to determine a given power change when passed the $V_{saturate}$ saturation point. This asks for a nonlinear control characteristic such as for example a piece-wise-linear one with an inflection point at $V_{kink}=V_{saturate}$ (see FIG. 3(b) lower side with continuous line).

In one embodiment of the power amplifier system 10, a linear output power ($P_{out}$) versus the power control signal ($V_{ramp}$) characteristic is achieved by using a nonlinear $V_{ctrl}$ ($V_{ramp}$) control curve as shown in FIG. 3(b) lower side with the solid line. The control characteristic has an inflection point, or "kink" point, at which a much faster slope of $V_{ctrl}$ variation versus $V_{ramp}$ is ensured (i.e. a higher control characteristic equivalent slope). This boosted control is designed to compensate for the saturation that takes place in the power amplifier system 10 and thus provides a roughly linear overall control curve as shown in FIG. 3(a) upper side with continuous line. Achieving a close to linear overall control characteristic is critically dependent on a good alignment between the power amplifier system 10 saturation point ($V_{saturate}$) and the "kink" point position in the control curve ($V_{kink}$). FIG. 3(b) shows the case of a perfect alignment between the two points, which leads to a good linearity (no bumps or valleys) in the power amplifier system 10 overall control characteristic. In real implementations, small miss-alignments of the order of few tenths of a volt or smaller may be tolerated.

The power amplifier system 10 of the present invention can use pulse-width modulation that changes the duty cycle of the waveform after the power amplifier system 10 hits its compression point, in order to ensure the remaining power control range. Since the power is the product of voltage and current, even if the voltage level is clipped, a higher power level can be achieved if a larger duty cycle is used for the current. Changing the duty-cycle of the RF signal is a non-linear signal processing. It in fact consists in increasing the conduction angle of the device after the output stage peak amplitude becomes clipped. If the main device of the output stage has a larger conduction angle the output current will have a larger average value, increasing the output power. Using the pulse width modulation for the last portion of the power amplifier system 10 control curve (passed the amplitude saturation point) ensures a more linear characteristic and a wider control range. Pulse-width modulation (PWM) can be used to change the power level also below the power amplifier system 10 saturation point, but a higher gain control loop would be necessary to maintain good linearity. In general combining amplitude and pulse-width modulation, either in a simultaneous fashion or a sequential fashion, may result in better efficiency at backed-off power level and/or an extended power control range.

Figures 4A, 4B:
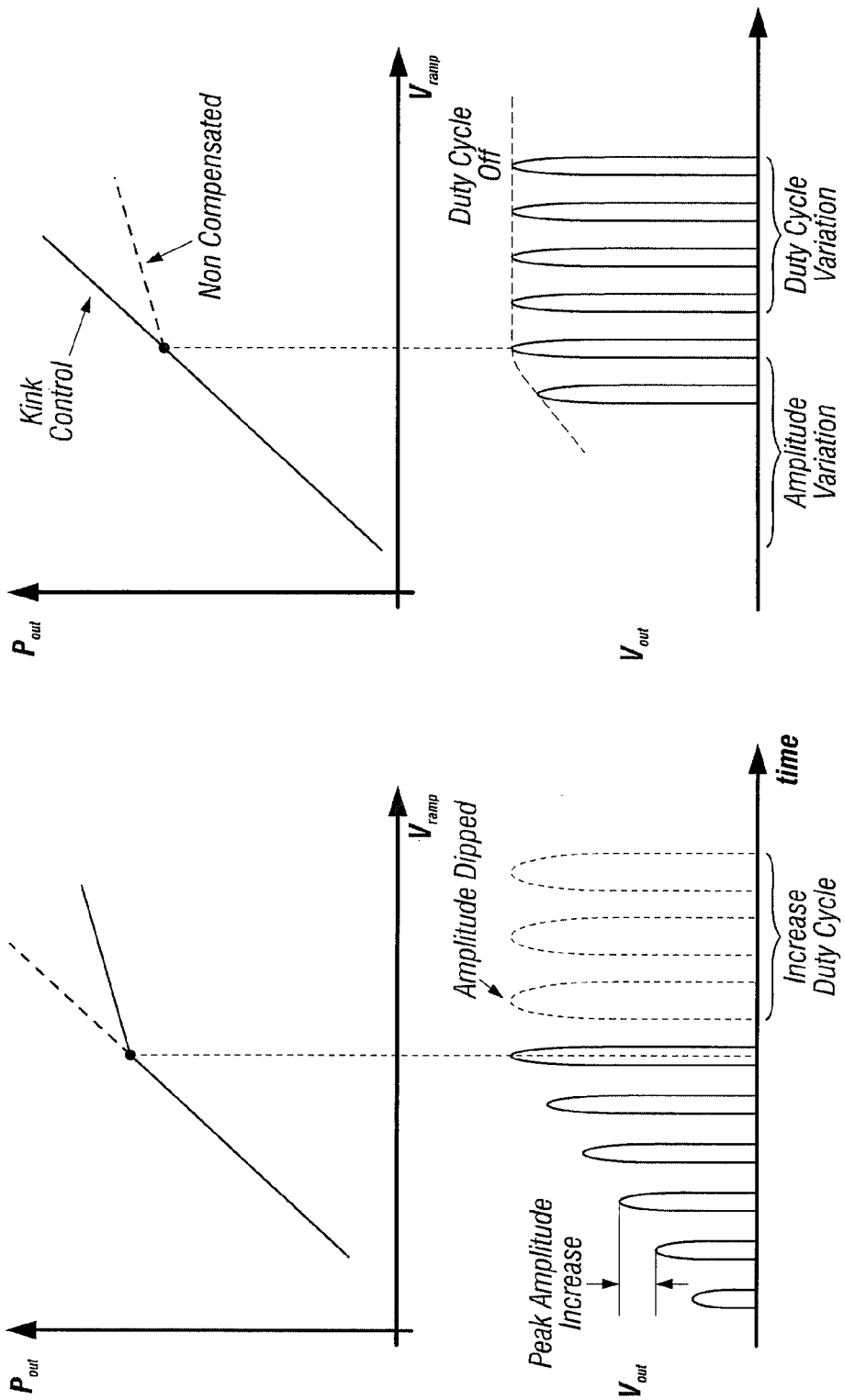

The pulse-width modulation as a means for increasing the power amplifier system 10 control range can also be viewed from the point of view of changing the class of operation as it relates to the output device conduction angle. At low power level the output stage can be operated in class C, with duty cycles less or even much less than 50%, as shown in FIG. 4(a), below the power amplifier saturation point and in FIG. 3(a). When the device operates in class C the duty-cycle of the current is small, which in urn result into a high duty-cycle for the output voltage (when device is ON $V_{out}$ is low, and when device is OFF $V_{out}$ is high). The class C operation can improve the efficiency at backed-off power level (lower than peak power level). To increase the output power the duty cycle is increased towards 50% ensuring a quasi-class B operation, as shown in FIG. 4(b) around the compression point and in FIG. 5(b). The output power can be increased by continuing to increase the duty cycle above 50% and thus ensure a class AB operation, as shown in FIG. 5(c). However, a class AB operation may result in stability issues for the power amplifier system 10.

Figure 6B:
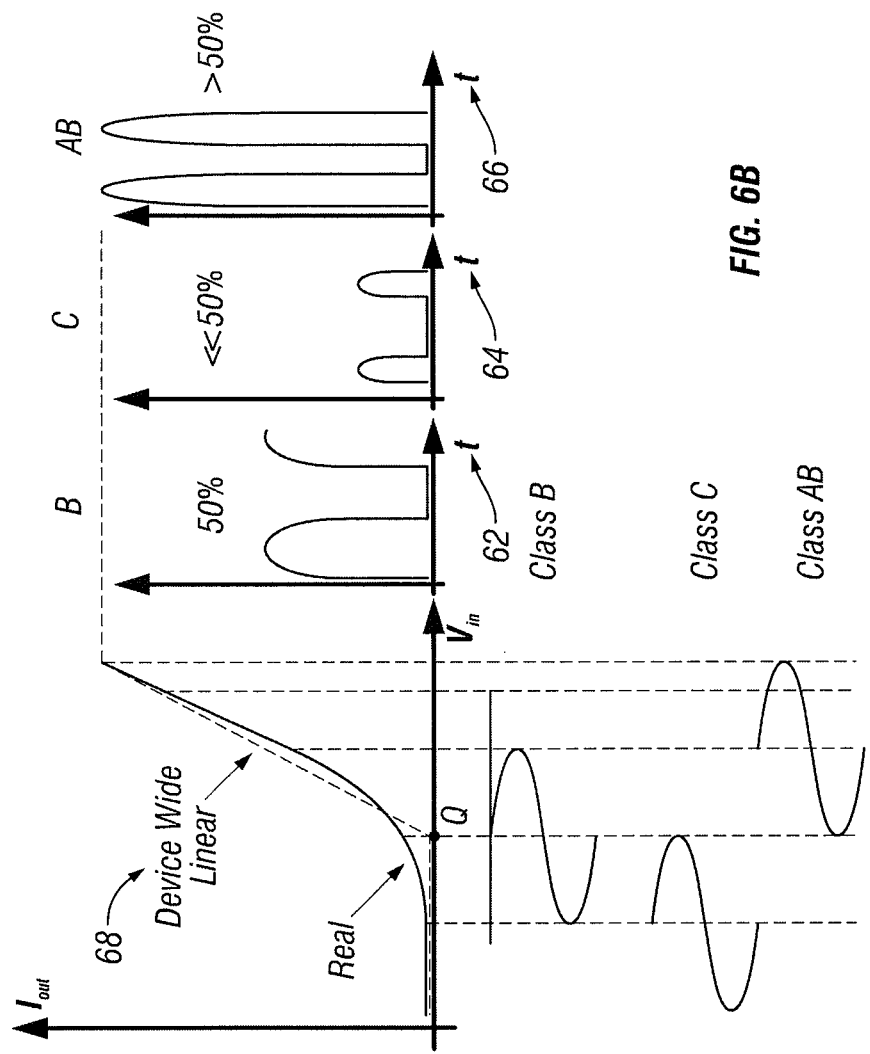
Figure 6A:
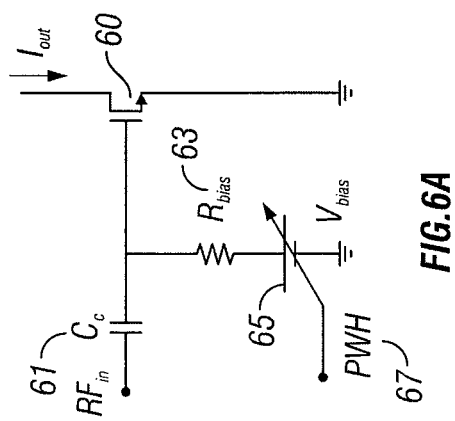

One possible embodiment of the PWM modulation is by using a variable bias point for a nonlinear device (e.g. a FET). FIG. 12(a) shows a simplified schematic of such a bias voltage modulator. The RF signal is applied directly to the gate of the output stage 60 through a coupling capacitance 61, while the variable DC bias voltage 65 is applied to the gate through a large isolation resistance, or alternatively inductance 63. FIG. 6(a) shows the non-linear characteristic of the FET that was approximated as a two leg piecewise linear curve.

FIG. 6(a) presents one embodiment of a circuit that can ensure the pulse-width modulation of the RF signal based on its peak amplitude value. Thus far we have described only a binary switch between the amplitude modulation and the pulse-width modulation. Such transition can be also realized in a continuous fashion. In FIG. 6(a) is shown a FET output stage which has a transfer characteristic with a threshold (can also be bipolar, HBT, or the like). When the bias point Q is set below the threshold voltage (by the $V_{bias}$ 65 adjustable control voltage), the device turns ON only for a short period of time at the peak of the signal. Therefore it operates in class C with a low conduction angle. When the bias point Q is set at or around the threshold of the device, the device is ON for roughly half of the signal period, resulting in a class B, or quasi-class-B operation. As the bias point Q is moved higher than the threshold, the device conducts for a larger period of time (wider conduction angle) and it operates in class AB.

The bias point of the output stage can be set by a dedicated. bias generator in the case of AC coupling between last driver 31 and the output stage 30, or it may be set by the driving stage in the case of a DC (direct) coupling architecture.

This operation can be one of the possible solutions for a power amplifier system 10 of the present invention having backed-off efficiency improvement through a combination of AM and PWM.

Figure 7B:
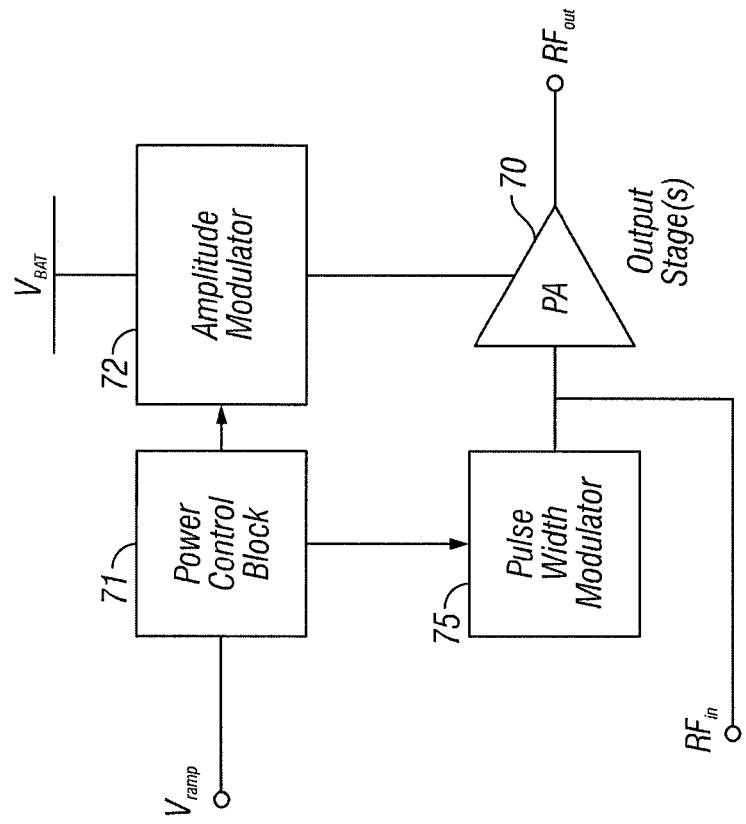
Figure 7A:
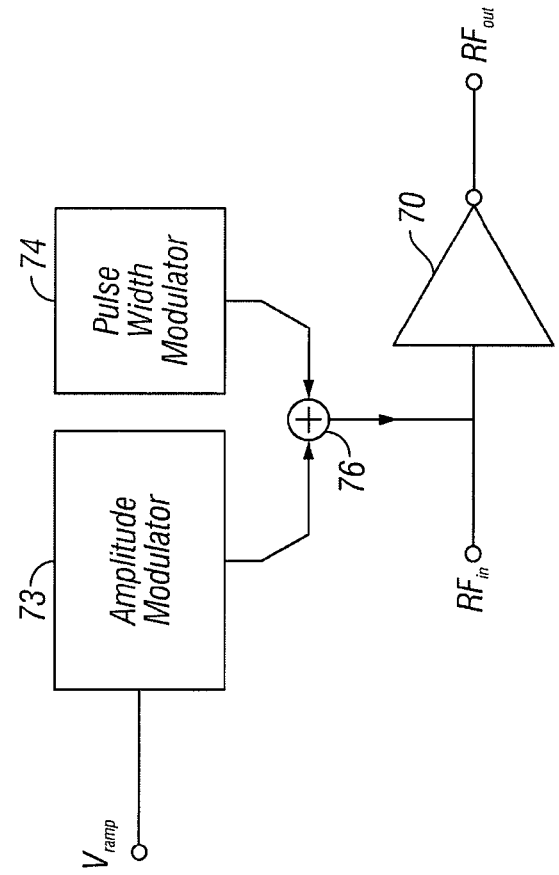

FIGS. 7(a) and (b) illustrate a top-level principle diagram of a power amplifier system 10 having improved efficiency at backed-off power level, achieved by combining the amplitude modulation with the pulse-width modulation to ensure a wider required output power variation range The two modulation techniques may be applied to the same power control port 79 of the amplifier system 10, as shown in FIG. 7(b). One such case is the gate control power amplifier system, and is illustrated in FIG. 7(b). Alternatively, the power control can be applied at different ports 77 gate and 78 drain, as shown in FIG. 7(a). One possibility for the configuration of FIG. 7(a) is that the amplitude modulation 72 is applied at the drain of the output stage, while the pulse-width modulation 75 is applied to the gate. For the configuration from FIG. 7(b), the two modulations, amplitude 73 and pulse-width 74 can be summed together and applied at the gate of the output stage 79. It is not feasible to control the duty cycle of the output stage from its drain port, while the output amplitude can be controlled both through the drain and the gate ports.

Figure 8A:
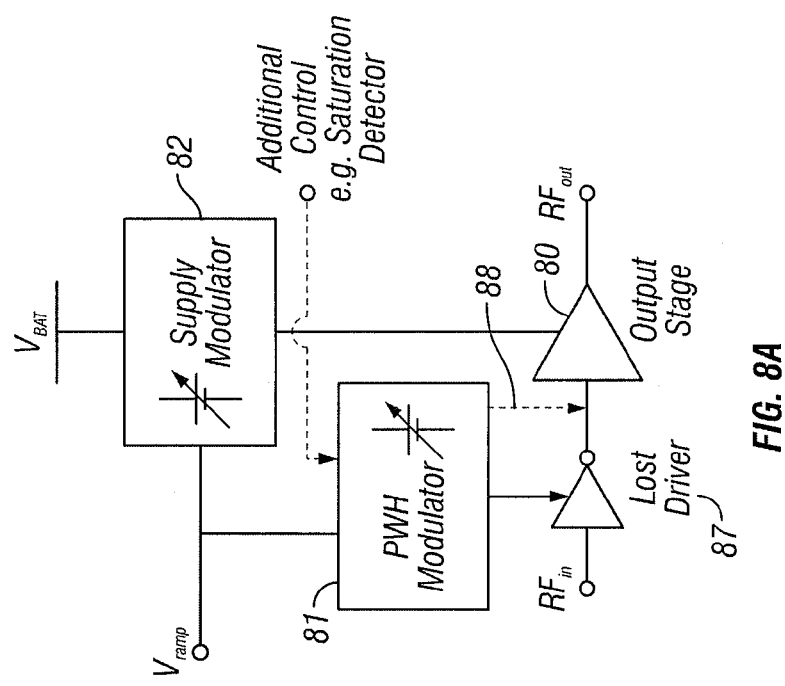
Figure 8C:
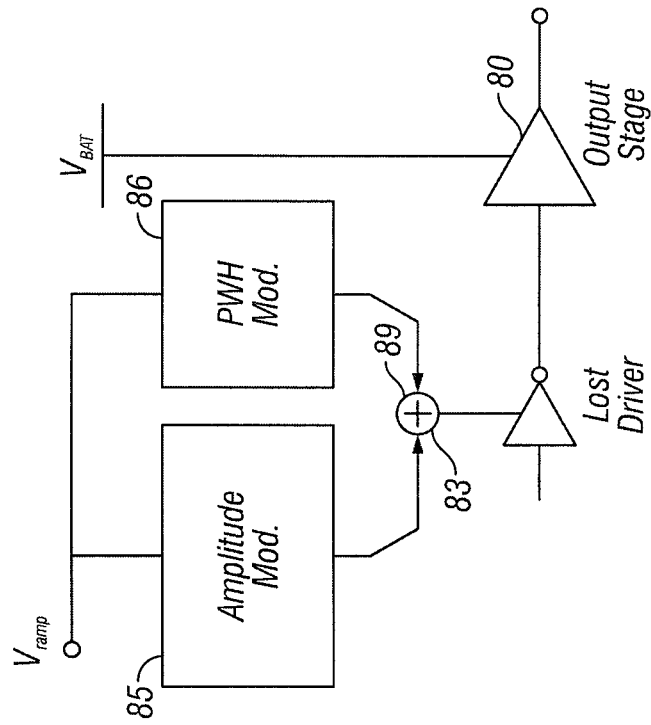
Figure 8B:
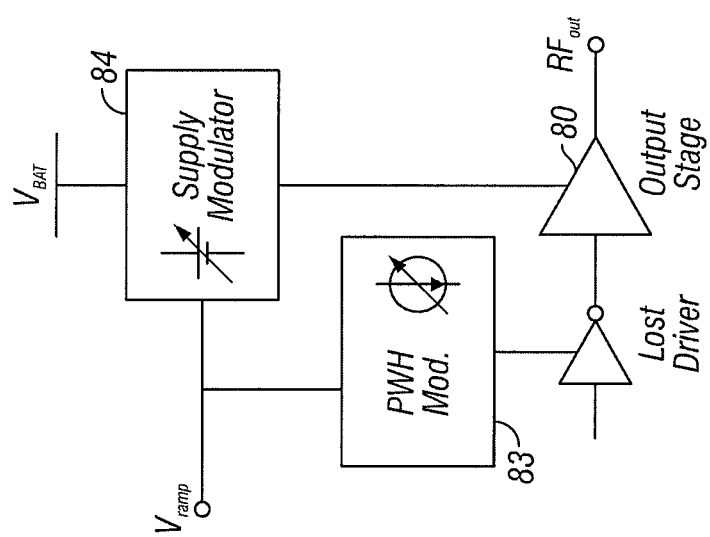

There are many ways in which the pulse width modulation can be impregnated onto the RF signal. FIGS. 8(a) through (c) offer several examples of possible implementations for the PWM modulation block. The solutions selected may be dependent on the architecture of the signal path: using voltage bias or current bias in the driver, and using drain or gate control on the output stage. In the case of voltage bias of the last driver, the PWM can be realized by either changing the bias voltage 81 of the driver 87 (if DC coupled), or the gate bias of the output stage 88 (if DC coupled), as shown in FIG. 8(a). If the driver uses a bias current, than the PWM can be generated by modulating the driver bias current 83, as shown in FIG. 8(b). If the output stage uses the gate control and the drain is connected to the battery (e.g. through an inductance), than the amplitude modulation 85 and the pulse-width modulation 86 need to be summed together 89 and they determine the bias voltage of the output stage 80, as shown in FIG. 8(c).

Figure 9B:
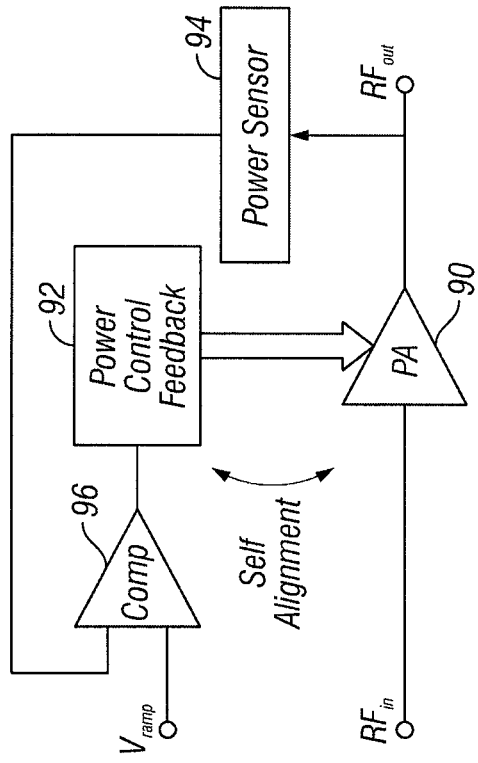
Figure 9A:
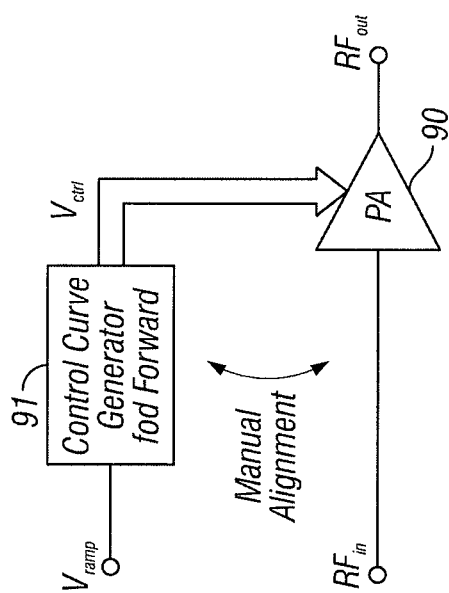

There are two main techniques used by existing power amplifiers to regulate their output level at a given targeted value, as shown in FIGS. 9(a) and (b).

An open-loop power control, as shown in FIG. 9(a), where an input signal ($V_{ramp}$) that gives the targeted power level is used to generate a control curve $V_{ctrl}(V_{ramp})$ 91, which finally controls the power amplifier system 90 output power level. Since the power control transfer function of the power amplifier system is nonlinear, a nonlinear control curve is needed to ensure an approximately linear $P_{out}(V_{ramp})$ control characteristic. The main issue of the open loop power control technique is the difficulty of aligning the control curve nonlinearity with the power amplifier system control nonlinearity, which often results in large nonlinearity of the overall transfer curve.

A closed loop power control, as shown in FIG. 9(b), where a feedback loop is closed around the power amplifier system, having enough gain and control range such that the nonlinearity of the power amplifier system control mechanism is taken out by the feedback loop action 99.

If the feedback loop has constant feedback gain the system works fine at low and moderate power levels giving decent linearity, but around the peak output power the loop gain drops dramatically and the overall system exhibits nonlinearity even when a closed loop is present. FIG. 10(a), shows graphically such a case.

Figure 10B:
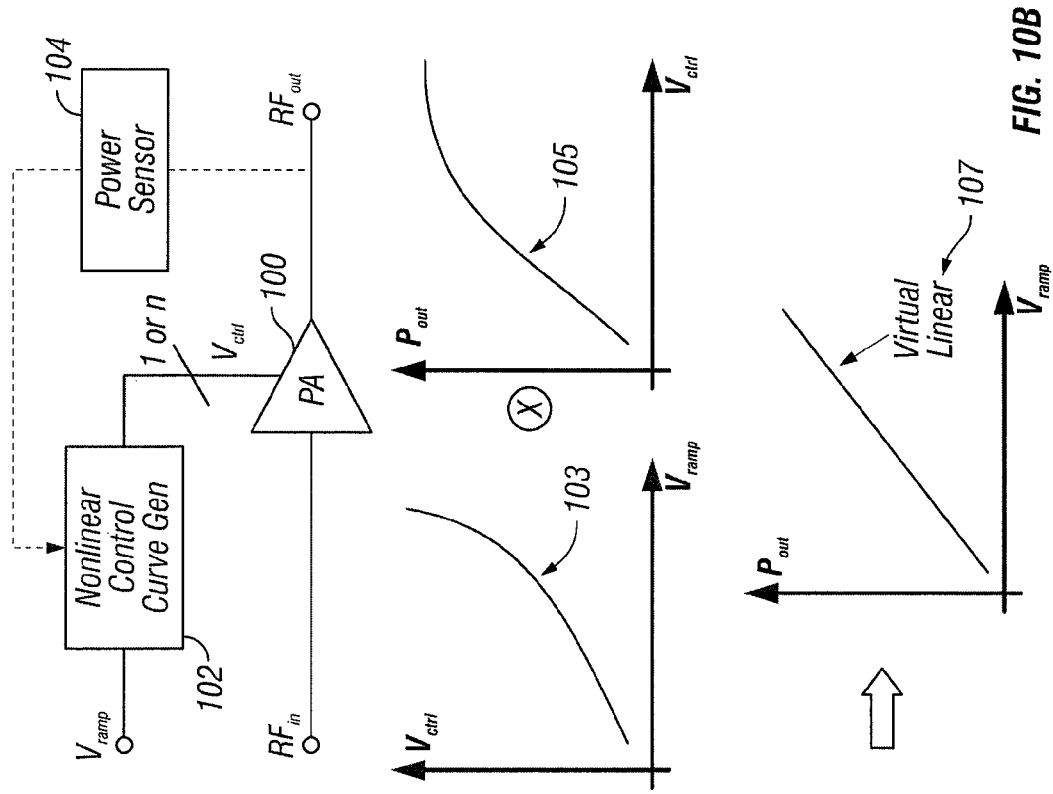
Figure 10A:
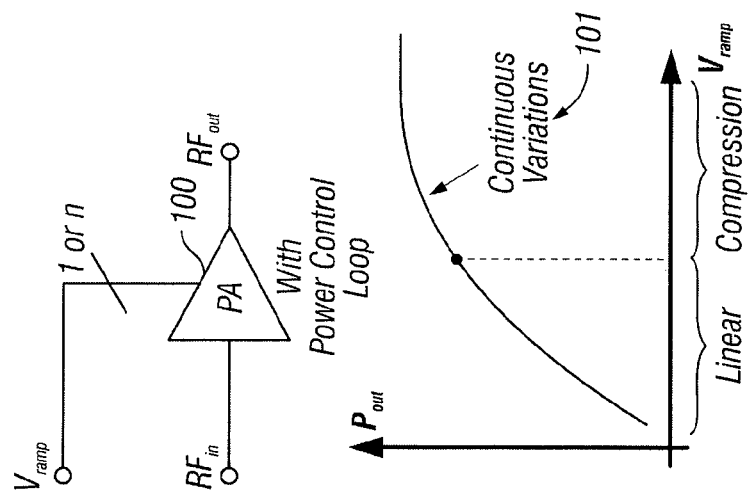

The power amplifier system 10 control nonlinearity $P_{out}(V_{ctrl})$ often has a compression characteristics needs to be cascaded with an inverse nonlinearity (expensive in this case) $V_{ctrl}(V_{ramp})$, with the goal of achieving a more linear $P_{out}(V_{ramp})$ overall power amplifier system 10 power control characteristic, as shown in FIG. 10(b). Such technique can be applied to both open-loop and closed-loop power amplifier system 10 power control schemes.

In an ideal control system with infinite loop gain, the input—output control characteristic (e.g. output power versus targeted power $P_{out}(V_{ramp})$) is a perfectly linear characteristic. At low and moderate output power levels the power control loop has enough gain and the resulting control curve is very close to the ideal one. However, as the system approaches the peak output power level, the power control loop gain decreases dramatically and the control characteristic stars departing from the ideal curve and shows one or more compression points, as illustrated in FIG. 12(a). When approaching the peak power level, the power amplifier system output stage devices enter in the strong triode (saturation for bipolar) mode of operation and it is much more difficult to generate a given output power variation. Therefore a much larger control voltage change needs to be created, which may not always be available.

Having a power amplifier system with the overall power control characteristic having a compression at high power level is a serious drawback. Since at lower than peak power levels the stages in the power amplifier system signal path tend to operate more linear, the efficiency drops very fast, resulting in a poor performance at backed-off power level.

The following address the different methods to generate the compensation of the nonlinear control characteristic, different shapes of the compensation characteristics, and several generalizations of the proposed power amplifier system 10 power control method.

The power amplifier system 10 power control loop is fundamentally a nonlinear system. However, in certain conditions its behavior can be approximated with the one of a linear system, resulting in an easier understanding and design procedure. There are several nonlinear mechanisms inside a power amplifier having a power control loop.

First, the amplifier output power ($P_{out}$) versus its control signal ($V_{ctrl}$) is very nonlinear. Most of this nonlinearity is compensated by the feedback loop if enough loop gain is ensured. The control curve may also suffer nonlinearities over supply voltage and other design corners.

The power sensing process is assumed to be rather linear, which in most cases is a valid assumption.

If a linear control curve is used, the overall power control loop is still very nonlinear. In particular the loop gain varies significantly with the power level, having very low values towards the peak power level. Therefore, a large nonlinearity will result towards the peak power even in power amplifier system 10 having a feedback loop. The compressive nature of the power amplifier system 10 control characteristic at high power levels (see FIG. 12(a)) can be compensated with an expansive control curve that gives larger loop gain at high power level (see FIG. 12(b)) and thus result in a more linear overall power amplifier system 10 control characteristic.

Figure 11A:
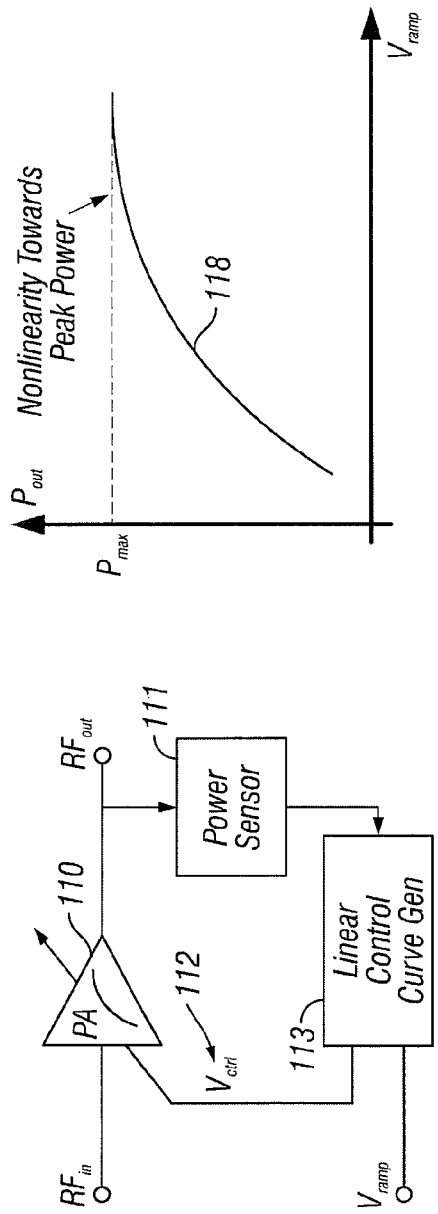
Figure 11B:
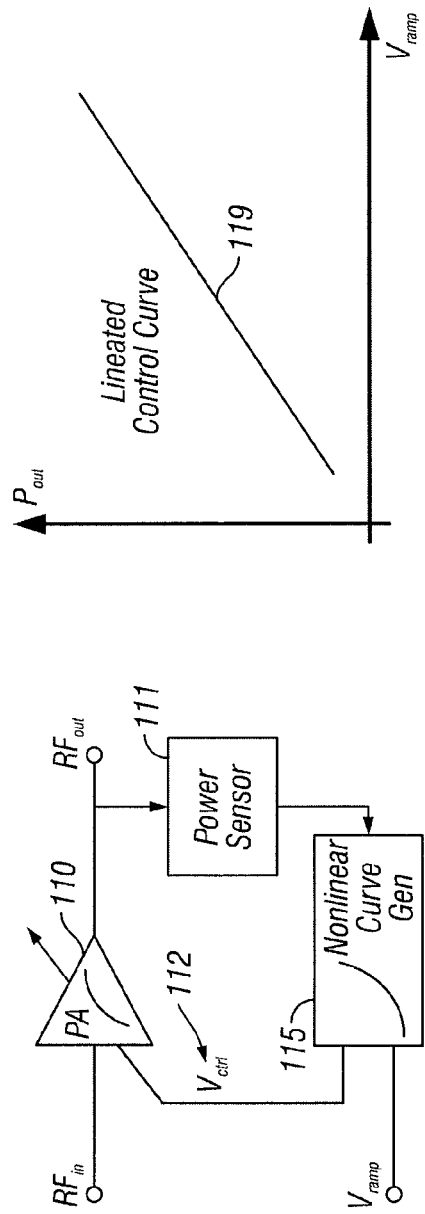
Figure 12B:
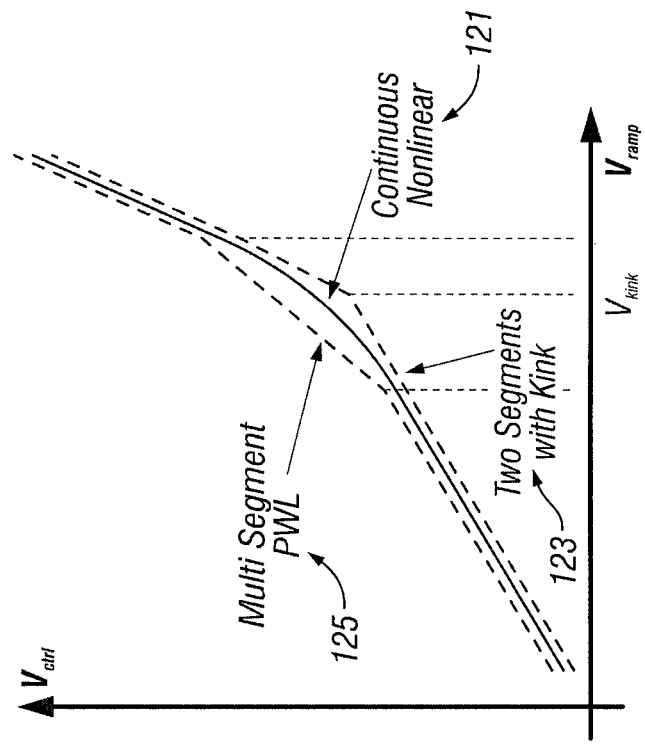
Figure 12A:
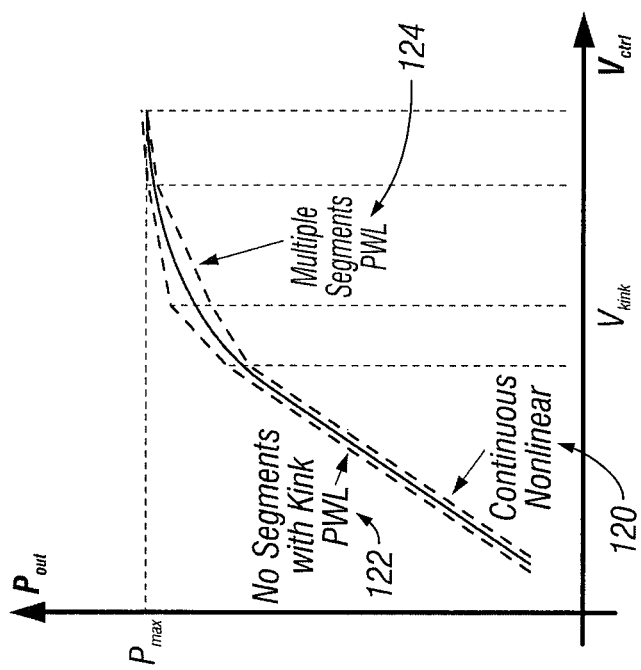

In one embodiment, as shown in FIG. 11(b), a second compensation nonlinearity (see FIG. 12(b) is added in the closed loop system 117 of the power amplifier 110, with the goal of compensating the starting power amplifier system 10 control nonlinearity (see FIG. 12(a)). The accuracy of such a control nonlinearity cancellation critically depends on the matching and tracking over the design corners of the power amplifier system 10 nonlinearity and the compensating control curve non-linearity. This invention will present several nonlinearity compensation techniques having different complexities and accuracy levels.

A continuous nonlinear power control characteristic of the power amplifier system 10 may have design corner variations such as: process, temperature, supply, frequency. Generating a continuous nonlinear compensation characteristic $V_{ctrl}(V_{ramp})$ which can undo the action of the power amplifier system 10 $P_{out}(V_{ctrl})$ control characteristic nonlinearity is not an easy thing to do. Special architectures that ensure alignment and level calibration may be needed. Achieving a simple power amplifier system 10 power control system may need a simpler mathematical approximation of the power amplifier system 10 control nonlinearity.

As shown in FIG. 12(a), a first order approximation of the power amplifier system 10 control nonlinearity is a two segment piecewise linear characteristic 122. Such a shape can be also seen as a linear characteristic with an inflection point ("kink") at a given $V_{kink}$ level. The corresponding compensation characteristic shown in FIG. 12(b) has a simple shape, with an inverse role (compression—expansion). A two segment piecewise linear control curve 123 is relatively easy to generate and it needs only two parameters to be added to the low and moderate power level linear control characteristic: a kink position $V_{kink}$ and the new slope after the kink.

The two segment PWL approximation is the simplest one except a straight line, linear characteristic, but by no means it is the single possible one. A higher accuracy can be achieved with a multi-segment piecewise linear approximation 124 of the power amplifier system 10 continuous nonlinear control characteristic 120 and it's corresponding inverse (compensation) control curve 125, as shown in FIGS. 12 (a) and (b). Three, four, or even more segments can be used in the PWL approximation. Although they give higher accuracy, such methods bring a significant complication to the system, requiring multiple fitting parameters to ensure a proper alignment and thus guarantee a linear overall power control characteristic. In some cases it may be easier to use a continuous nonlinear compensation characteristic instead of a multi-segment PWL characteristic. The robustness of the power control compensation depends on the shape selected and the associated method used to implement it.

Figures 13A, 13B, 13C:
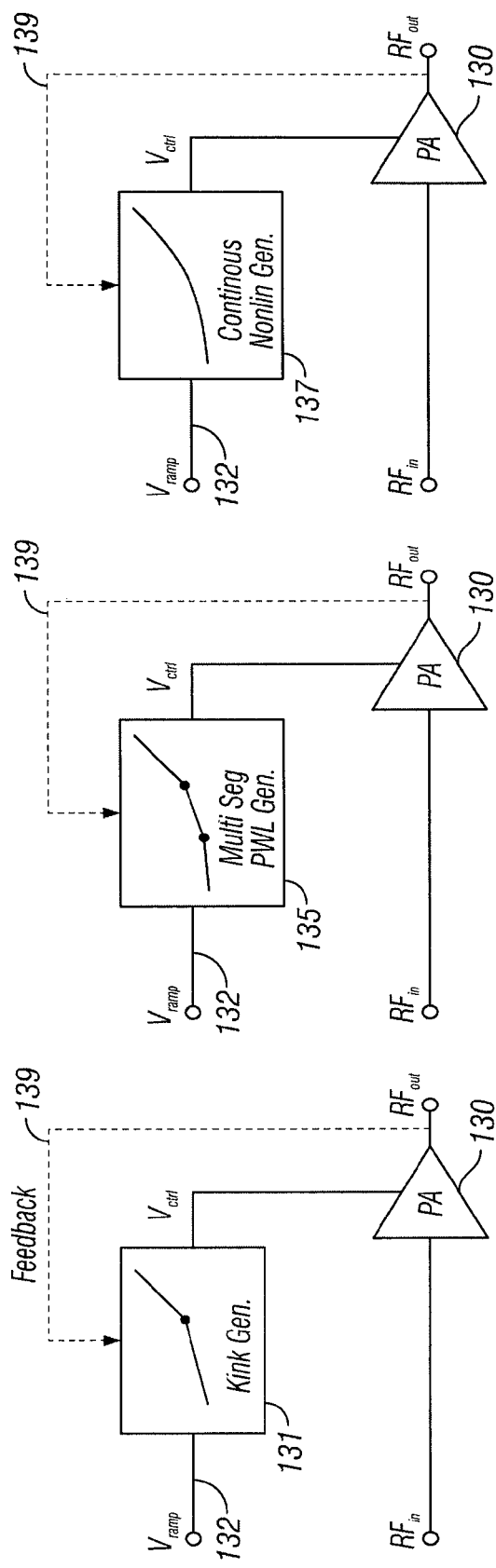

FIGS. 13(a) through (c) present several implementations of the power amplifier system 130 power control linearization technique. FIG. 13(a). uses a kink generator 131 to create a two segment piecewise linear characteristic. It can either be open-loop 132 or closed-loop 139. If just a linear (constant slope) power control is used, in order to achieve the right control signal values at the peak output power level, a too large control at moderate and low power levels is needed, and thus a poor efficiency at backed-off power levels.

A two (or more) segments nonlinear control characteristic 135 has the advantage of giving the necessary drive level when close to the peak output power level, and a much lower drive at moderate and low output power to help achieve a better efficiency at backed-off output power levels. In FIG. 13(b) a three (or more) multi-segment nonlinear power control compensation is presented, while in FIG. 13(c) a continuous non-linear power control compensation is shown.

There are at least two main ways of realizing a saturated power amplifier system 10 for constant envelope applications.

Using the supply modulation technique, also known as "the polar" power amplifier system 10, or yet the drain power control power amplifier system 10, as shown in FIG. 14(a). In this case the last driver 142 and the output stage 140 operate all the time in saturation region.

Using the gate power control, when the supply voltage to the last stage is always the battery itself and the power control is applied mainly to the last driver stage 141, as shown in FIG. 14(b).

The last driver 143 operates saturated but with a variable supply voltage, and thus a variable signal swing and output common-mode voltage, while the output stage 141 operates most of the time linear and saturates only for the very last few [dB] of the power range. The enhanced efficiency at backed off power levels will be applied differently to these two power control architectures, but they are using the same technique of combining amplitude and pulse-width modulation to get the required power control range and linearity.

To compensate for the power amplifier system 10 control nonlinearity, a nonlinear control curve needs to be used. A nonlinear characteristic can be viewed either as a piecewise linear approximation having different inflection points that need to be ensured by the control circuit or, as a continuous varying nonlinear characteristic.

Figure 15B:
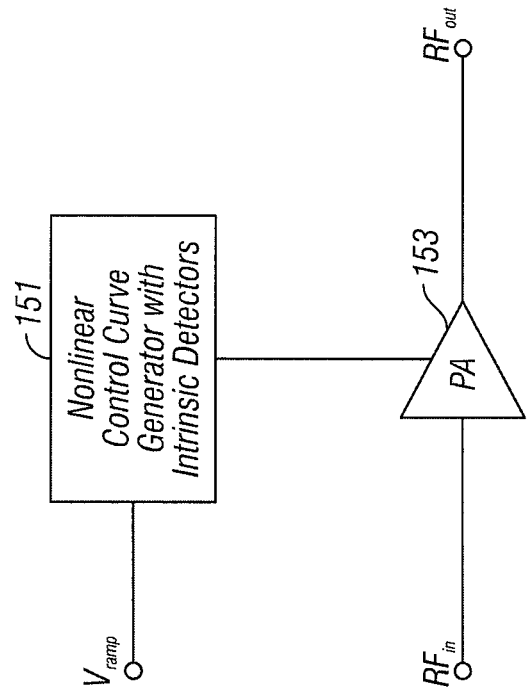
Figure 15A:
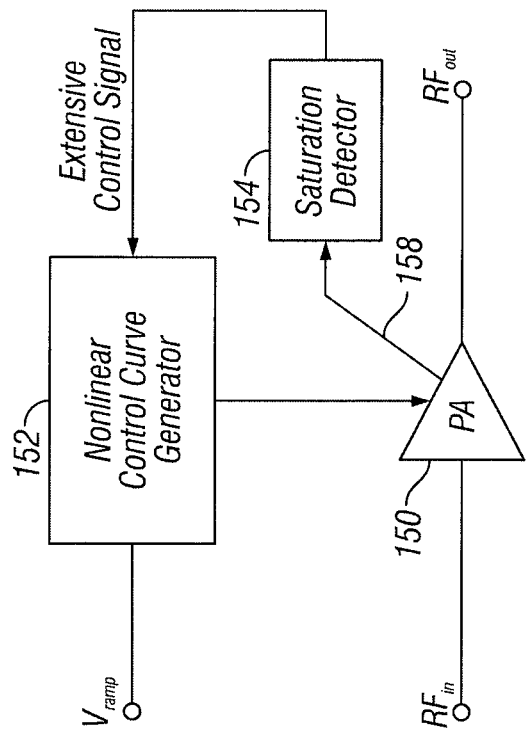

FIGS. 15(a) and (b) show some possible embodiments of the nonlinear control curve implementation, with different ways of aligning the control nonlinearity with the power amplifier intrinsic nonlinearity. One possible technique that can be used to detect the power amplifier system 150 nonlinearity point is using a saturation detection circuit 154, as shown in FIG. 15(a), which provides a detection signal to determine a nonlinearity (e.g. "kink" point) in the control characteristic provided by the control curve generator 152. The saturation detection is an additional loop that is added to the power amplifier system 10. Since the loop is not linear, it needs a careful analysis for proper behavior over the design corners. The advantage that such an extrinsic nonlinearity control generation has is a self alignment with the power amplifier 150 control nonlinearity through the saturation detection process. However, the complexity of the control curve is usually low (e.g. two segment piecewise linear) and therefore the overall power amplifier system 10 controlled linearity is limited.

Another solution is to use a continuous nonlinear control curve that is embedded into the control circuit 151 and that does not need any additional detection loop, as shown in FIG. 15(b). Such a technique is simpler and may provide a better overall power amplifier system 10 control linearity, provided a good matching of the power amplifier 150 control nonlinearity with the inverse of the control curve 151 is achieved. The main challenge in such an approach is that the power amplifier 150 control nonlinearity is usually strongly dependent on the supply voltage, process and temperature and therefore the nonlinear control curves will need to track such changes. Tracking may not be easy to ensure in the absence of the saturation detection sensors that are good at self-aligning the two nonlinearities.

Figure 16B:
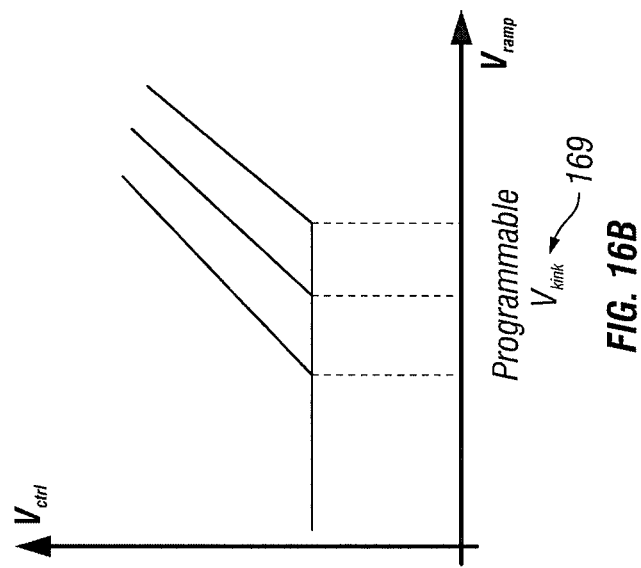
Figure 16A:
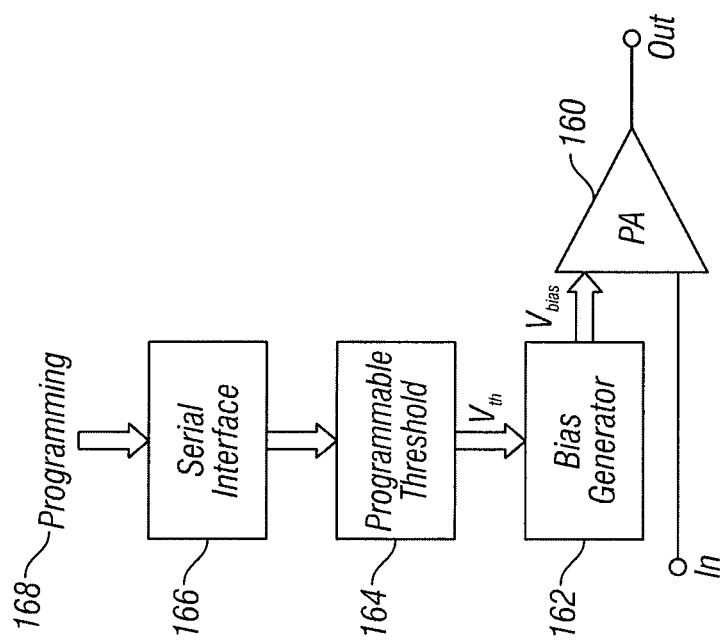

FIGS. 16 (a) and (b) show a power amplifier 160 that uses a nonlinear (piece-wise-linear) control characteristic with a programmable inflection (kink) point position 169. Such programmability can be ensured both in analog ways, or in digital ways, through for example a serial interface 166.

FIGS. 17 (a) and (b) show an exemplary embodiment of a power amplifier system 10 power control linearization technique using a continuous nonlinear characteristic with no saturation detection control signals. It was applied to the power amplifier output stage 170, using the gate power control technique and having the last driver 172 DC coupled to the output stage 170, as shown in FIG. 17(a). The power control block 174 regulates the bias signal of the last driver stage 172. At low power levels the bias signal of the last driver is relatively low and the resulting driver signal swing and average (common-mode) output voltage is also low 179. This ensures a class C operation of the output stage that has its gate biased low, as shown in FIG. 17(b) 171 waveform. As the output power moves towards moderate levels, both the driver bias signal and its average output voltage 179 are increasing, determining a close to class B operation of the output stage 170 (see FIG. 17(b) waveform 173). The pulse-width modulation is progressively added to the amplitude modulation, resulting in a continuous nonlinear control characteristic, as opposed to a piecewise linear characteristic given by the saturation detection kind of scheme. At very high output power level the driver supply signal and thus the output signal swing together with the average (common-mode) voltage 179 continues to grow, bringing the output stage 170 into the class AB operation area (see FIG. 17(b) waveform 175. At very high power levels, close to the targeted peak it is usually the case that the output stage also saturates and the power control past that point is given only by the pulse-width modulation component.

There are many phenomena that may generate saturation inflection points in the power amplifier system 10 control curve. This is particularly true for the multi-cascode output stages (e.g. two, three or even more cascade devices). Therefore, one generalization of the proposed efficiency boosting technique is to use a control curve having more than one inflection (kink) point, as shown in FIG. 18(a), characteristic 180. Such multiple kinks and different slopes of the control curve may come handy if the power amplifier system 10 exhibits multiple saturation actions (points).

Figure 18B:
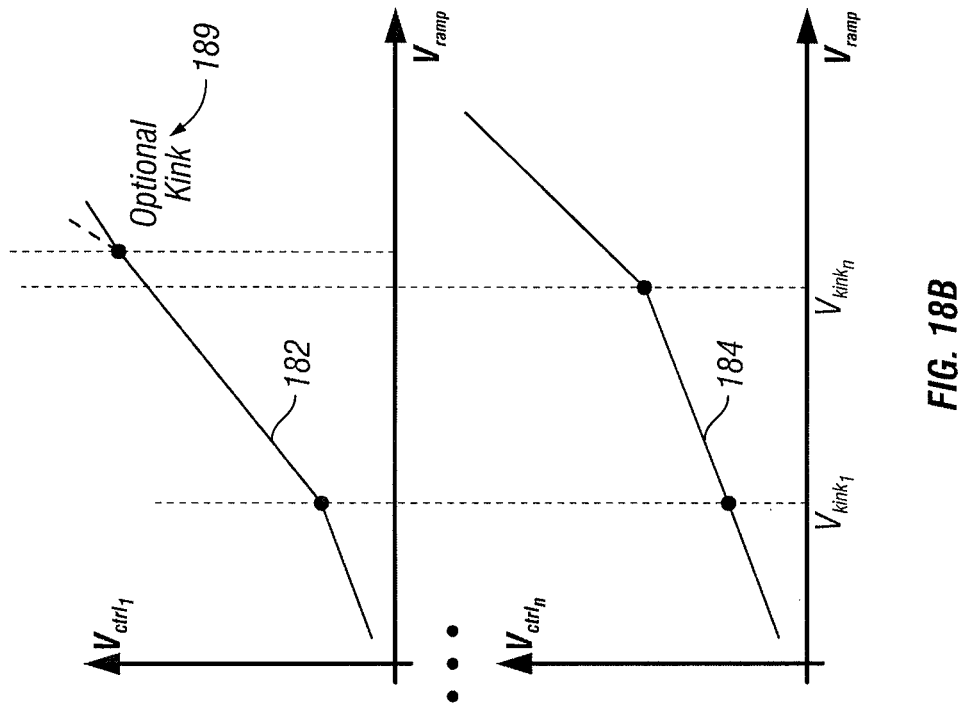
Figure 18A:
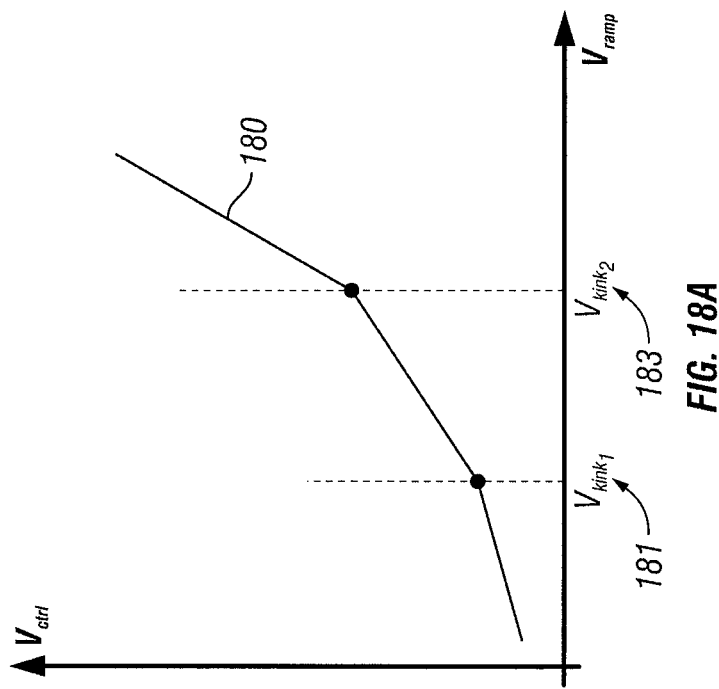

Yet another generalization of the kink-based power amplifier system 10 efficiency improvement is to use multiple control curves having kink points, as shown in FIG. 18(b), characteristics 182 and 184. This is particularly handy if the output stage has multiple gates that need bias voltages. The kinks of the individual control curves can be all synchronized at a given target power level ($V_{ramp}$ voltage), or alternatively the kinks may happen a different control voltages ($V_{ramp\_i}$), as shown in FIG. 18(b) 189. The multiple control curves may have one or even more inflection points.

The power control scheme can actually use more than a single control signal. In the previous embodiment we have presented an example where only the bias current (or alternatively the bias voltage) of the last driver stage is controlled by the loop. In FIGS. 19 (a) and (b) an alternative embodiment of the power control loop is shown, where multiple control points are used, including: the last driver bias (not shown), the output stage 190 cascode gate voltages (VG2=Vctrl2 194 and Vg3=Vctrl2 196) for the DC coupled case), or the main and cascode gate voltages (Vg1=Vctrl1 192, Vg2 and Vg3) for the AC coupled driver—output stage case.

Figure 19B:
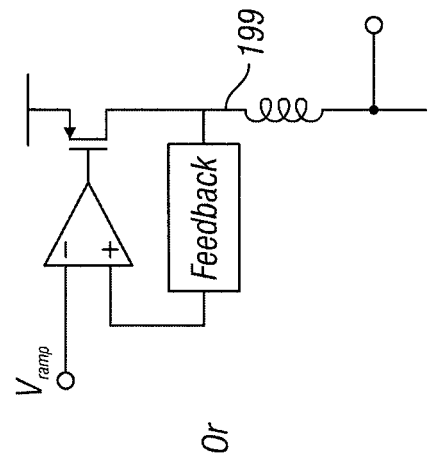
Figure 19A:
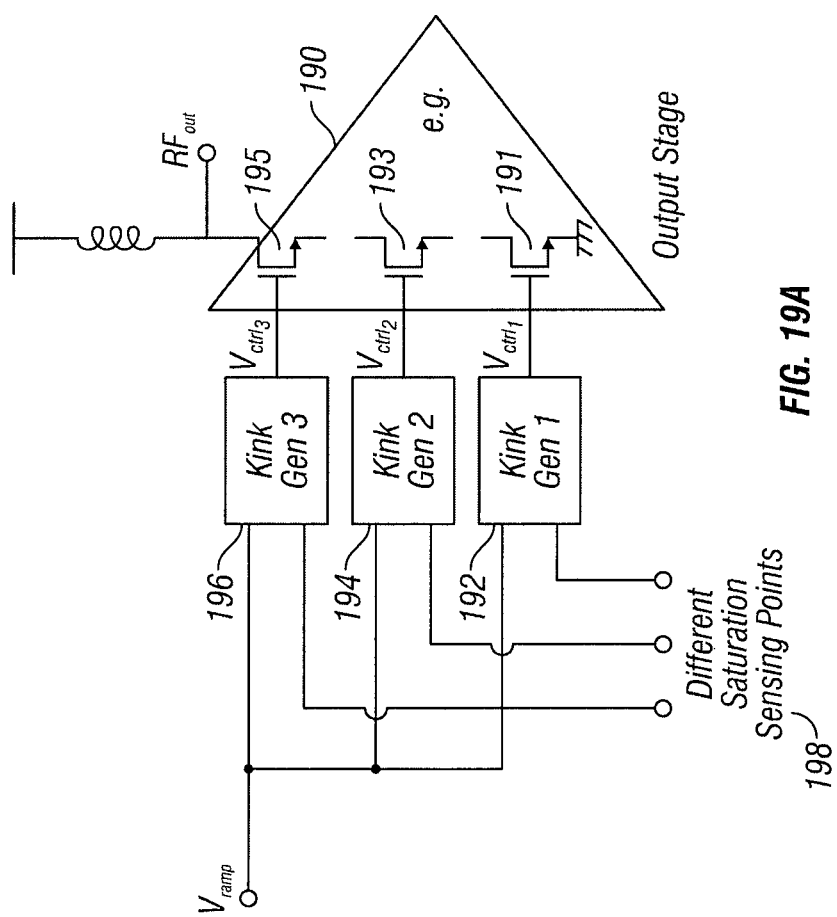

In this case the multi-kink control characteristic for the power amplifier system 10 output stage has three curves corresponding to the three devices in the output stacked structure 191, 193, 195. Therefore, there are three gates that need bias voltages. Optimizing the power amplifier system 10 performance over a wider output power range requires that all these voltages are dependent (modulated) by the targeted output power signal ($V_{ramp}$). Each gate bias voltage may have its dedicated kink generator 192, 194, 196, with a specific Vkink_i voltage. Alternatively all gates, or only part of them may share a single kink generator. Such a configuration can be used both for the gate power amplifier system 10 control scheme, as shown in FIG. 19(a) and for the drain power amplifier system 10 control scheme, as shown in FIG. 19(b). Using a multiple curve and/or multiple kink control characteristic may lead to a better optimization of the power amplifier system 10 performance over a wider power range. This is crucial for ensuring a boosted efficiency at backed-off power levels.

Figure 20:
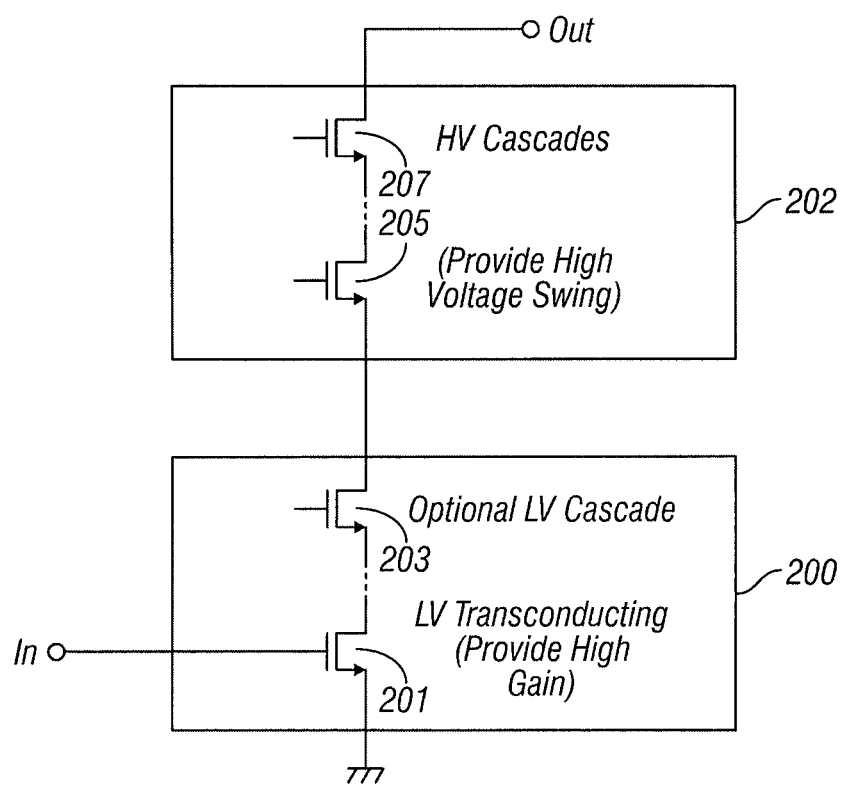

Due to the lower voltage handling capability of the CMOS process, most high power amplifiers use cascode type output stages. FIG. 20 shows a typical implementation of a cascode output stage using a low-voltage (LV) FET block 200, with LV main device 201 and LV cascode 203, and a high-voltage (HV) FET protection block 202, with one 205 or more 207 HV cascode devices.

Figure 21C:
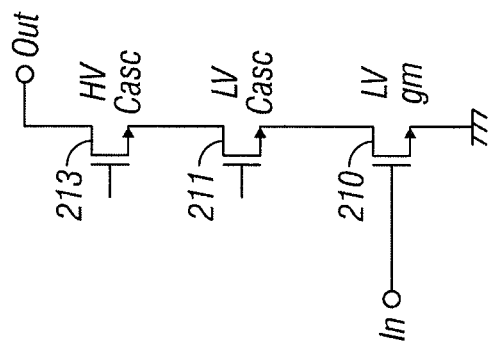
Figure 21B:
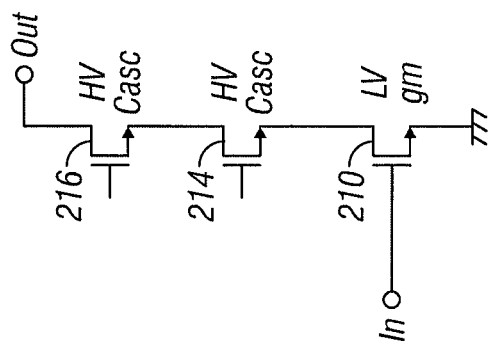
Figure 21A:
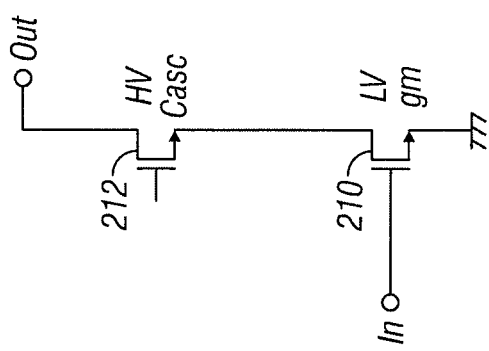

FIGS. 21(a) through (c) present several embodiments of hybrid LV-HV cascode output stages: using an LV main transconductance device 210 and a single HV cascode device 212 (see FIG. 21(a)), two HV cascode devices 214 and 216 (see FIG. 21(b)) and one LV cascode 211 and a HV cascode 213 (see FIG. 21(c)).

Figure 22B:
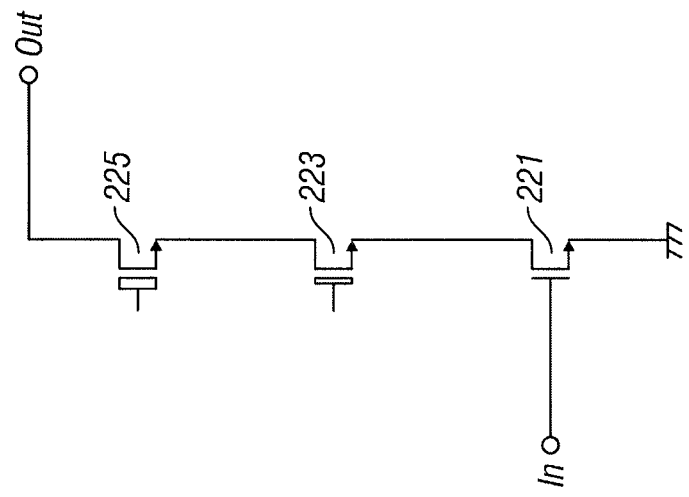
Figure 22A:
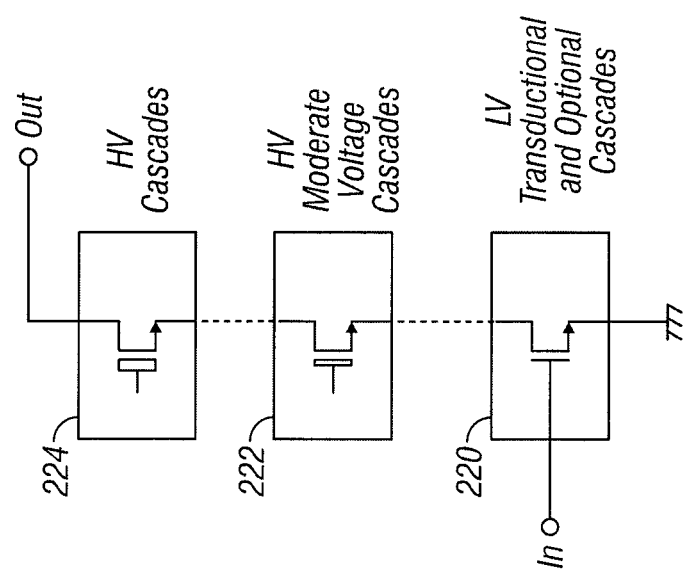

22(a) shows a principal implementation of a cascade output stage using more than two flavors of FETs: low-voltage (LV) 220, intermediary or moderate-voltage (MV) 222 and high-voltage (HV) 224. FIG. 22(b) show an exemplary embodiment of such a multi flavor output stage using only one LV 221, one MV 223 and one HV 225 FET.

Figures 23A, 23B, 23C:
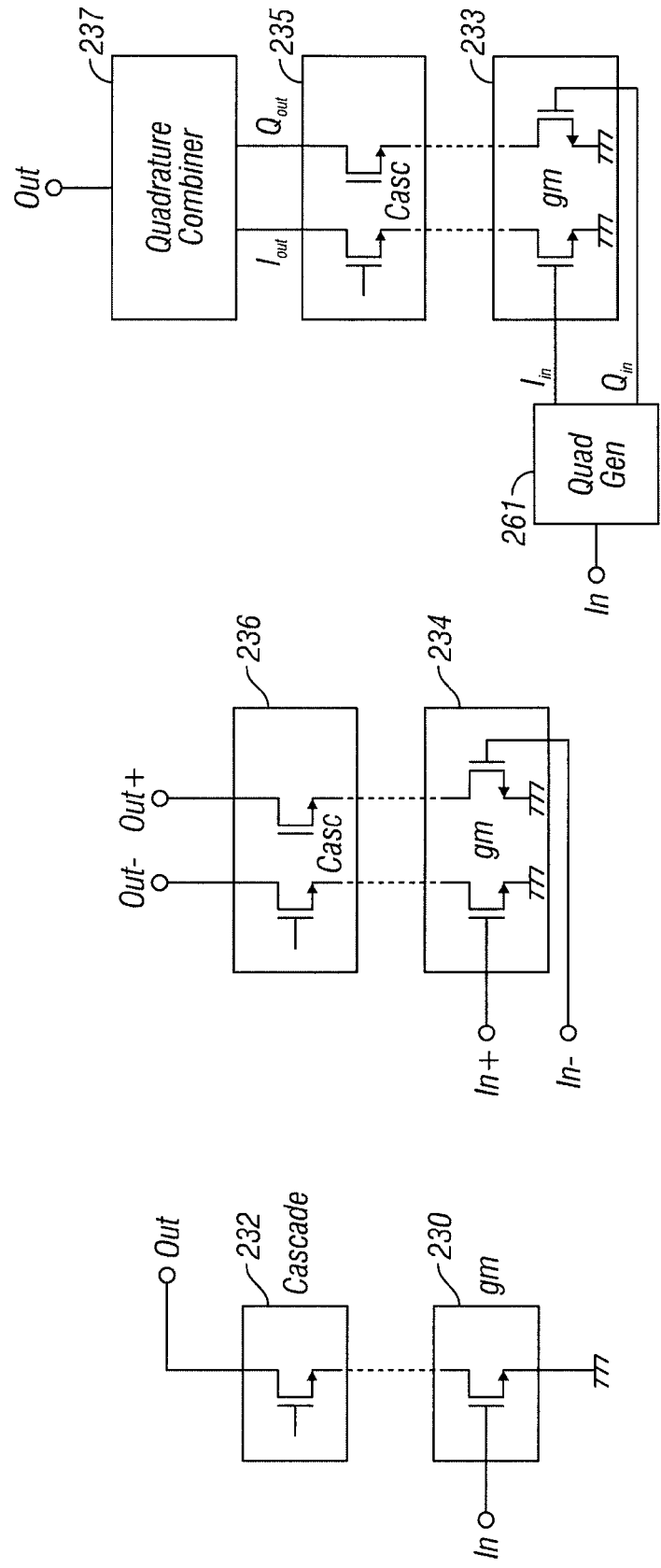

FIGS. 23(a) through (c) show different types of cascode output stages to which the present invention can be applied: single ended 230 and 232 (a), differential 234 and 236 (b) and quadrature 233 and 237 (c).

Figure 24:
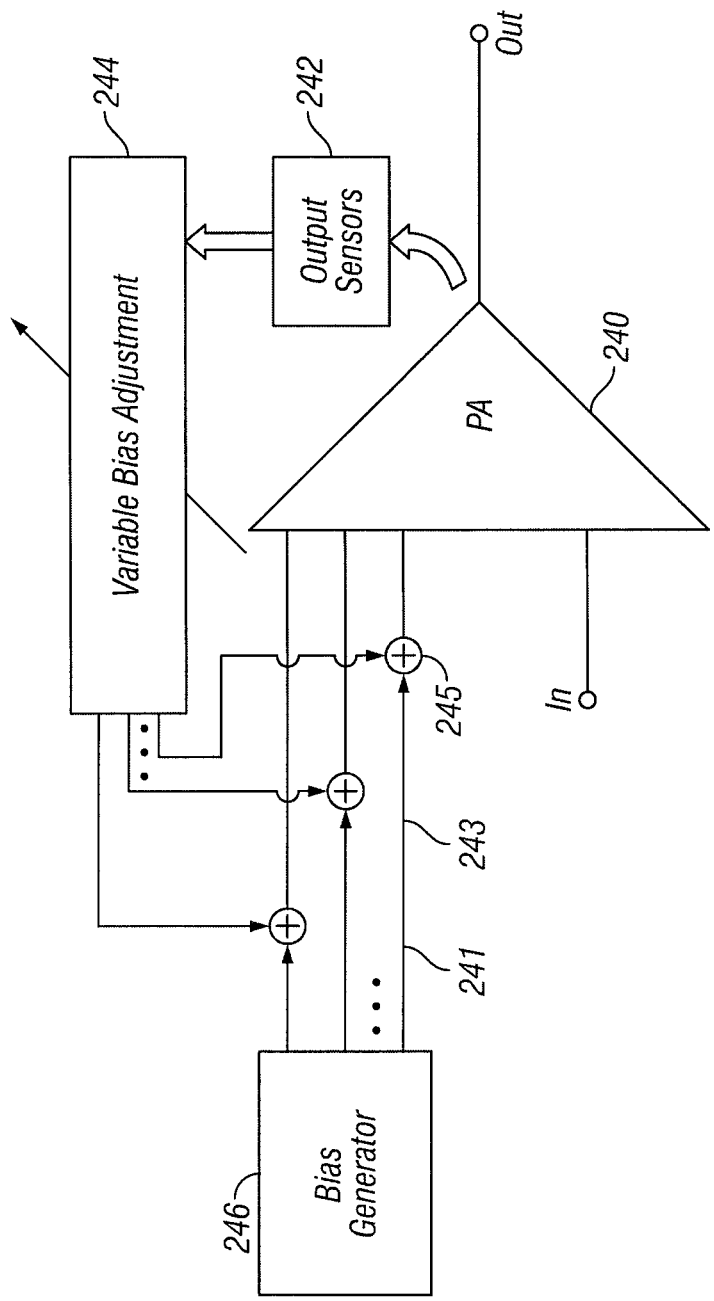
FIG. 24 is a schematic diagram of a power amplifier using variable bias adjustment for performance improvement, in one embodiment of the present invention.

FIG. 24 shows a power amplifier top level architecture using signal path stages 240 that have a variable (adjustable) bias voltages 241, 243, 245. This adjustability can be used for different purposes, as shown in the following paragraphs.

Figure 25:
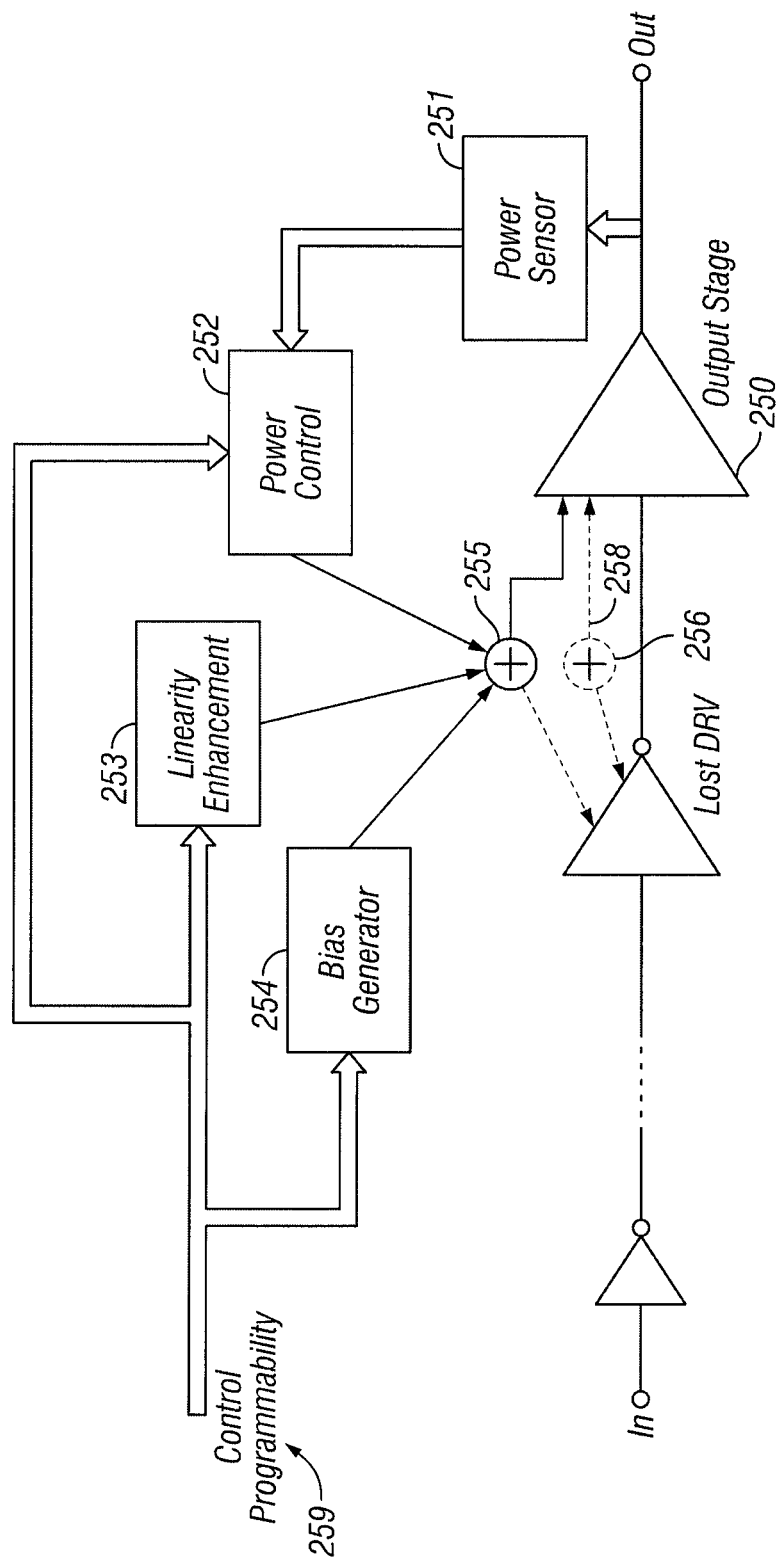
FIG. 25 is a schematic diagram of a power amplifier having both power control and a linearity enhancement circuit determining the adjustable biasing condition, in one embodiment of the present invention.
Figure 26:
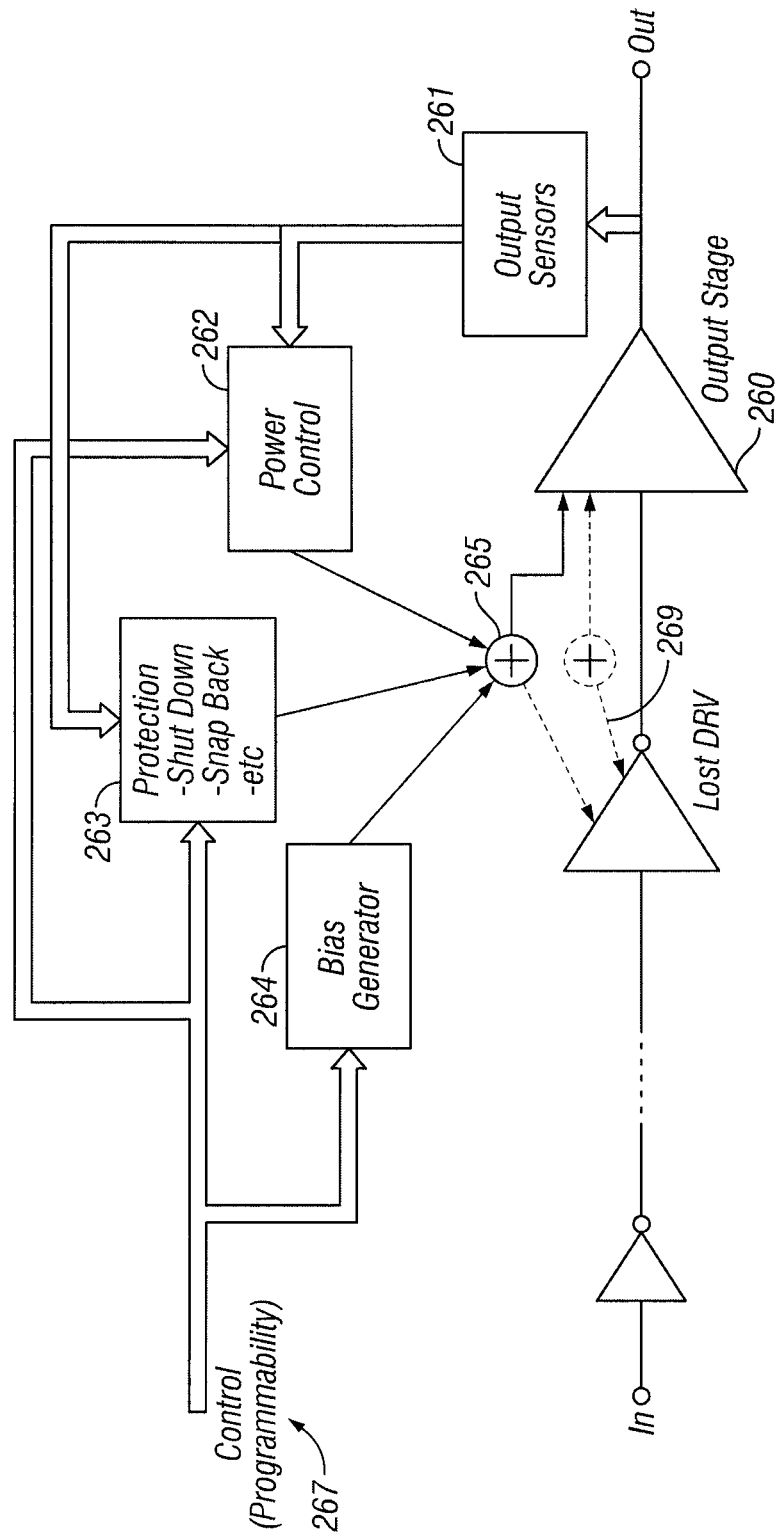
FIG. 26 is a schematic diagram of a power amplifier having both power control and a protection circuit to control the adjustable, in one embodiment of the present invention.
Figure 27:
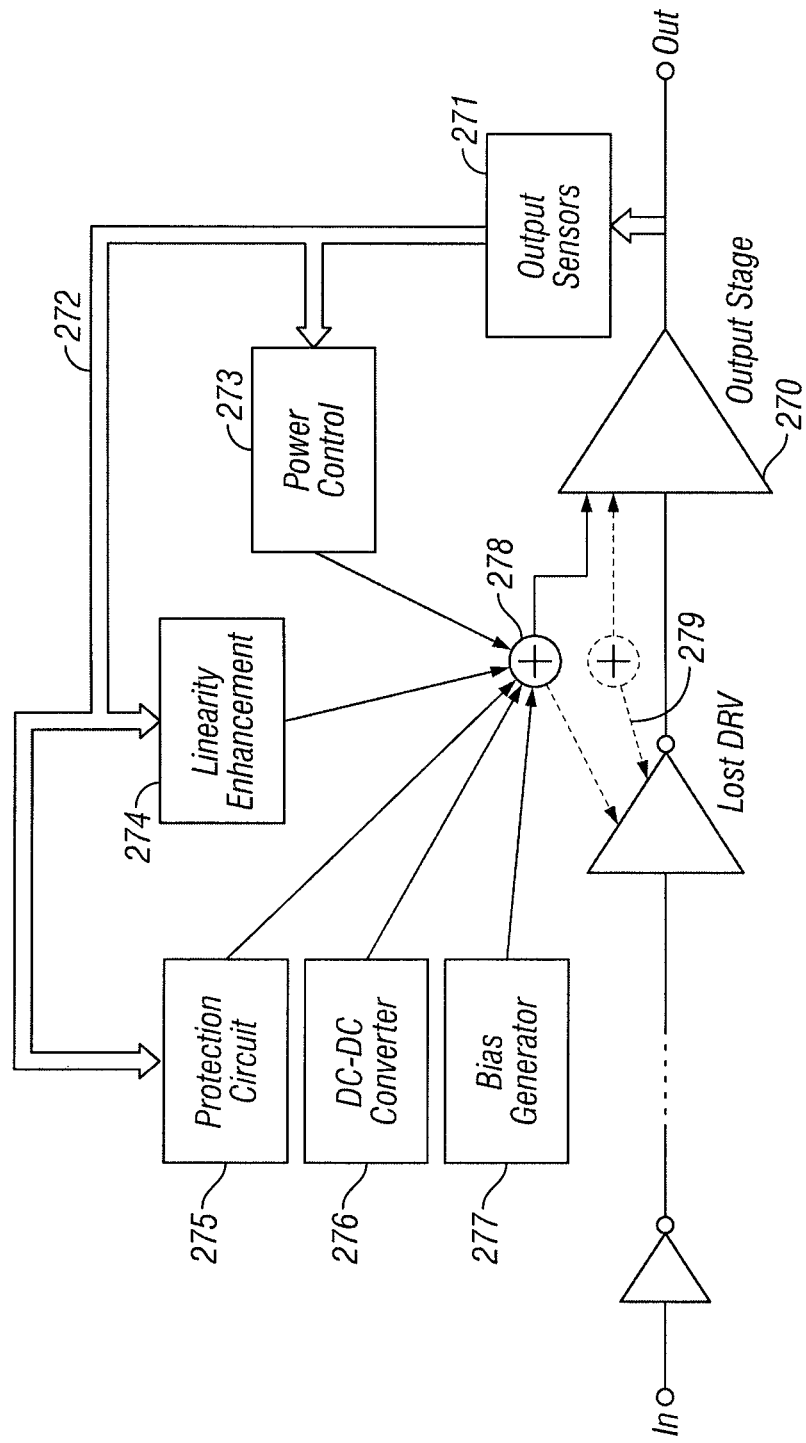
FIG. 27 is a schematic diagram of a power amplifier with multiple circuits injecting the signal path adjustable biasing with power control, a protection circuit and linearity enhancement, in one embodiment of the present invention.

FIG. 25 shows the top level diagram of a power amplifier using adjustable bias set by both the power control block 252 and a linearity enhancement block 253. FIG. 26 show the top level diagram of a power amplifier using adjustable bias set by both power control block 262 and a breakdown and/or snapback protection block 263. FIG. 27 shows a more general power amplifier top level diagram that has the adjustable bias set by the power control block 273, the linearity enhancement block 274, the protection block 275 and any optional DC-DC converter 277.

Figure 28:
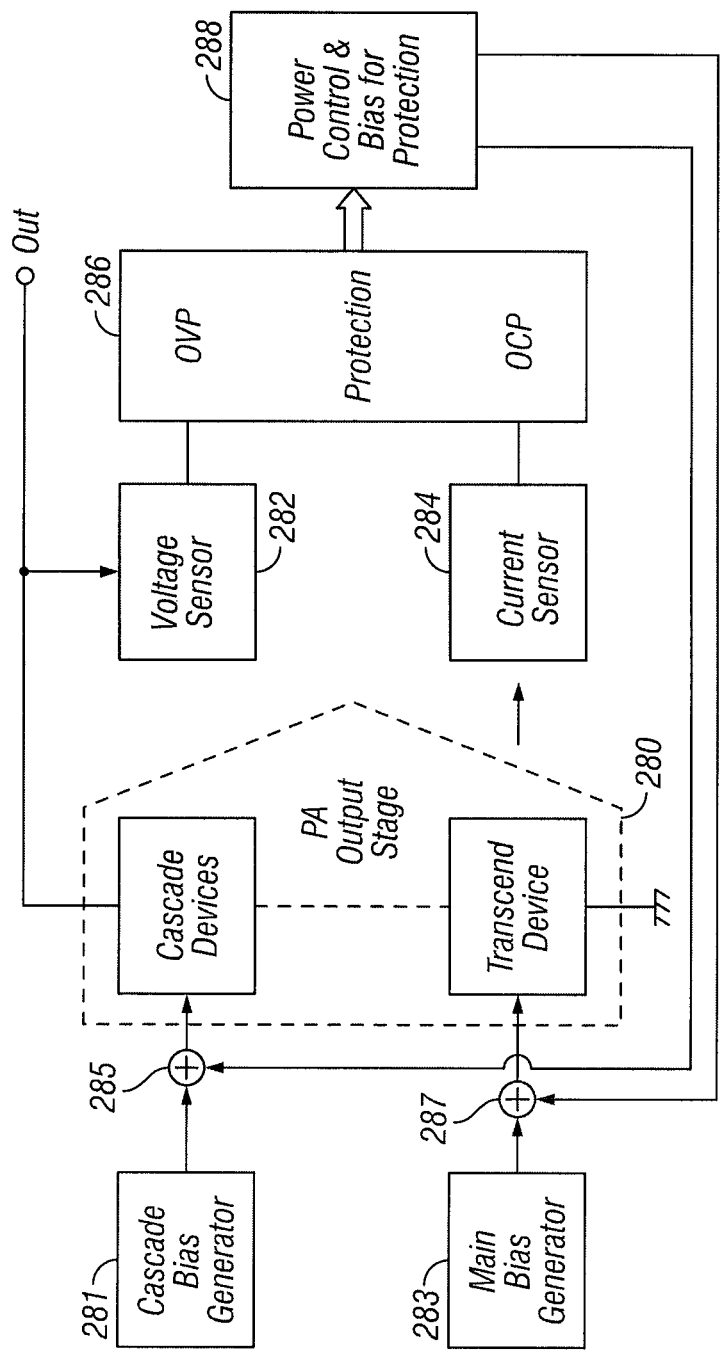
FIG. 28 is a schematic diagram of a power amplifier suing a cascode output stage and over-voltage with over-current protection circuits to provide variable bias conditions, in one embodiment of the present invention.

FIG. 28 gives the top level diagram of a power amplifier having the adjustable bias point set by a power control block 288 which works in conjunction with over-voltage OVP and over-current OCP protection blocks 286. They set both the bias of the main transconductance stage 287 and the cascode stage 285 of the output stage 280.

FIG. 29(a) shows the use of the nonlinear control curve generator 292 for a hybrid main 290 and cascade gate 294 power control power amplifier. The control curves 295, 296 and 297 (see FIG. 29(b)) have inflection points which may be aligned automatically or manually to the power amplifier control nonlinearity.

The power amplifier system 10 output power level dependence of the control characteristic is not the only hard nonlinearity generator, although in most cases it is the dominant one. Another important element to the power amplifier system 10 control nonlinearity is the supply voltage level (Vbat). Depending on the type of power control technique used (drain or gate), the supply voltage can have a significant impact on the output power level, as shown in FIG. 30(a) shows an exemplary embodiment of the power amplifier system 10 output stage using a gate power control technique that has the gate of the cascode devices as compensation points for the supply voltage dependence, while FIG. 30(b) gives the associated characteristics. A $V_{bat}$ dependence circuit 309 generates an extra cascode gate supply voltage that is summed up 303 with the normal cascode voltage generator output 307. The bias of the cascodes may also have a power control component 305. For example the cascode voltage can be derived from the supply signal of the last driver 301, which is power level dependent. A linear dependence between Vgcasc and VDDdrv can be used at low and moderate supply levels, while the cascode voltage is boosted above this level at high power amplifier system 10 supply voltages. This will result in higher linearity of the power amplifier system 10 power control over the supply voltage range.

FIG. 31(a) shows an exemplary embodiment of a cascoded output stage using a cascode voltage bias which provides breakdown relief at high output voltage amplitudes. In this case the voltage given by the regular cascade bias generator 316 is summed 318 with the signal given by an output voltage amplitude sensor 314. As shown in FIG. 31(b) at moderate power levels the cascade voltage is flat 311 or even decaying 313, while at high power levels a significant boost of the cascode voltage is provided to reduce the voltage stress of the last high-voltage cascade device 312.

FIG. 32 shows an exemplary embodiment of a cascode output stage 320, where the cascode voltage 327 is adjusted by a block 324 which ensures linearity enhancement, breakdown protection or performance optimization. In FIG. 33 the cascode voltage 333 is generated by a DC-DC converter 332. The last one may be clocked by a clock generator block 334 driven by the output, input or any intermediary RF signal.

FIG. 34 shows an exemplary embodiment of a cascade output stage having an adjustable cascode bias set by a block 344 which seeks to achieve the modulation of the power amplifier nonlinear output capacitance 341, in order to improve the overall AM-to-PM distortion of the amplifier.

FIG. 35 shows an exemplary embodiment of a cascade output stage 350 that uses an adjustable cascode bias 357 in order to provide snapback effect avoidance in the last HV cascode FET 354 with it 356 parasitic BJT. One simpler embodiment of the snapback avoidance can be achieved by using a voltage sensor 366 and an OVP block 368 to adjust the gate bias voltage of the last cascode device 364, as shown in FIG. 36.

FIG. 37(a) shows an open loop kink power control having the kink generator 378 outside the power control loop. In this case it is crucial that the kink point $V_{kink}$ 377 and the power amplifier saturation point $V_{sat}$ 375 are well aligned. In FIG. 37(b) a small misalignment is shown, having a minor implication on the overall power amplifier power control characteristic nonlinearity 371.

It is rather typical that the power amplifier system 10 compression point is strongly dependent on the supply voltage. If a larger supply voltage is provided to the power amplifier system 10, the output stage gets larger voltage headroom and a higher output amplitude can be generated, resulting in higher output power. Therefore, the power amplifier system 10 compression point 384 will move at higher power level 385, as shown in FIG. 38(a) and (b). As a result, if the kink voltage 386 is manually aligned to the power amplifier system 10 compression point for the case of nominal power supply value (see FIG. 38(a)), then when the supply voltage increases, the power amplifier system 10 compression point moves at higher power levels 385 and the fixed kink point 387 will result in overdrive and bring a large control characteristic nonlinearity, as shown in FIG. 38(b). Similarly, the power amplifier system 10 compression point may move with other design parameters such as temperature, process, frequency etc. It is apparent that a manual alignment of the power amplifier system 10 control curve kink to the power amplifier system 10 compression point will result in poor control linearity over the design space.

A better solution is to use an automatic alignment of the control curve kink with the power amplifier system 10 compression point, that will ensure a good matching between the two and thus a high linearity of the overall control characteristic. To ensure such a tracking process, an additional feedback loops need to be closed across the power amplifier system 10, as shown in FIGS. 39(a) and (b). In one embodiment, it may include a saturation detector 392 that tells the kink generator 394 when to introduce the kink point in the power control block 396 characteristic, (see FIG. 39(a)). Since the kink is generated by the power amplifier system 10 entering into the compression region, in the ideal case a perfect alignment between the control curve kink and the power amplifier compression point may be possible. In reality, the accuracy of the alignment depends on the quality of the saturation detector 392. There are many ways in which a power amplifier system 10 saturation (compression) detector can be implemented, and the proposed technique applies to all of them.

The implementation of the saturation detector depends strongly on the power amplifier system 10 architecture: if it uses drain or gate power control, and if it uses voltage or current mode signal processing. There are also many ways to implement the kink generator itself its architecture is strongly dependent on the type of driver that is used. FIGS. 40(*a*) through (*c*) presents as exemplification several solutions for the kink point introduction. If the driver 402 uses a voltage mode bias 406, then the kink can be generated 404 by summing directly into the driver bias voltage 406, as shown in FIG. 40(*a*). Since the supply regulator is the most often used voltage-mode bias circuit, the kink can be generated by summing for example to the regulator's reference voltage. If the driver 401 uses a current-mode bias 408, as shown in FIG. 40(*b*), the kink generator 404 may give a current that is directly added into a wired-or fashion to the main bias current 408. Another technique to introduce the kink, aside from the driver bias voltage and/or current change, is to change the driver size 403, as shown in FIG. 40(*c*). This can be achieved in many ways, including analog, digital and mixed signal techniques.

FIG. 41 illustrates one embodiment of the power amplifier system 10 of the present invention using drain power control 414 and a voltage mode saturation (compression) detection 412. The bias voltage of the power amplifier system 10 output stage 410 is given by a supply regulator 414. The voltage-mode saturation detection 412 determines the point when the drain to source voltage of the regulator's output device 415 has crossed a minimum threshold from where the regulator will be considered saturated and thus no further voltage amplitude change can be generated through supply modulation.

The saturation detector 412 controls the kink generator 416, which in turns modulates the bias voltage 419 to the input device of the output stage 410. In this implementation the two control feedback loops are kept separate. The main power control feedback loop is closed at the drain of the output stage, while the auxiliary efficiency boosting feedback loop is closed at the gate of the output stage. Therefore, the power amplifier system 10 in fact uses a hybrid drain and gate power control scheme.

FIGS. 42(*a*) and (*b*) provides typical characteristics of such a hybrid drain and gate power amplifier system 10 power control scheme. For most of the power control range the power amplifier system 10 output power is varied by changing the power amplifier local supply voltage. As long as the drain control voltage is lower than the supply battery voltage ($V_{bat}$), the power amplifier system 10 control characteristic is rather linear 420. Once the drain control voltage has reached close to the Vbat voltage, the power amplifier system 10 enters in the compression regime and it is very difficult to get subsequent output power variation through drain modulation. This point is detected by the saturation detector, which commands the kink generator to start increasing the gate control voltage 422 of the power amplifier output stage, while the drain control voltage 420 is roughly clamped at the $V_{bat}$ level, as shown in FIG. 42(*a*). FIG. 42(*b*) gives the power amplifier system 10 efficiency variation 421 over the output power level ($P_{out}$) which is described by the $V_{ramp}$ target power level signal. In the classical drain-only control the efficiency 423 drops rapidly within a few [dB] from the peak output power level. With dotted line we give an example of a standard power amplifier efficiency variation 423 when using linear control curves technique. It can be seen that while the peak efficiency is roughly the same, the proposed technique gives significant efficiency boost at backed-off power levels. This improvement can be about 50% or higher.

FIG. 43 shows yet another embodiment of the present invention applied to a power amplifier system 10 using a drain control scheme implemented with a supply regulator 434, and having a saturation detector. This time a current saturation detector 432 is used. Similarly, the saturation detector 432 commands the kink generator 436 to change the slope of the control signal versus the $V_{ramp}$ voltage characteristic, which is given by the bias generator 438. The current saturation detector 432 may use a replica current leg, connected off of the supply regulator output device 439. Using a voltage, current or other types of power amplifier saturation detectors is transparent to the present invention.

One important element that influences the way in which the kink generator is implemented and put together with the bias generator is the way in which the last driver is coupled with the output stage. FIG. 44 shows an example when the last driver 443 is AC (capacitive $C_{AC}$ 445) (40) coupled with the output stage 440. In such a case the driver 443 bias voltage, or current has no impact on the bias voltage of the output stage 440 and therefore cannot determine the pulse-width modulation of the output RF signal. To ensure the pulse-width modulation of the output RF signal in the output stage, the bias generator 446 including the kink needs to be connected directly at the gate of the bottom device 448 from the output stage 440. The gate bias of the output stage is the main control point for the saturation detection loop. However additional (optional) control points can be used, such as the bias voltages of the cascode devices 447 from the output stage 440, as shown with dotted line in FIG. 44.

FIG. 45 shows the case when the last driver 458 is DC (direct) coupled to the output stage 450. In this case the bias voltage of the output stage is set by the average (common-mode) voltage 459 at the output of the last driver 458. Therefore, the kink generator 454 can be used to modulate the bias voltage 455 or current 453 of the last driver 458. Such bias can be under the control of the main power control loop, as is the case for the power amplifier system 10 with the gate power control, or it may be an output power level independent bias. The DC coupling is preferred since it avoids the use of large-size floating capacitors that takes a large area and thus increase the cost. Furthermore, the AC coupling may result in signal loss across the floating capacitors that may perturb the operation of the output stage (e.g. instability issues).

FIGS. 46(*a*) and (*b*) is a more detailed embodiment of a power amplifier system 10 using a hybrid drain and gate power control technique to ensure a control curve with an automatically aligned kink, which results in a boosted efficiency at backed-off power levels. A generic saturation detector 464 is shown off the supply regulator 462, while the kink generator 468 output is summed 469 to the main bias generator output 467. In this case both the main bias generator 467 and the kink generator 468 are under the control of the $V_{ramp}$ voltage (see FIG. 46(*a*)). An alternate solution is to use the kink generator 465 to modulate the gain of the bias generator 463 and thus create a different slope for the control curve. In this case the kink generator 465 will play a multiplicative role on the main bias generator 463 and thus only the last one is under the $V_{ramp}$ control (see FIG. 46(*b*)).

FIG. 47 shows another embodiment of this invention applied to a power amplifier system 10 using a drain power control with a supply regulator 472 and a current-based saturation detection 474. The current sensed buy the saturation detection leg 474 is compared with the current of a leg that does not saturates as the output power increases (the output stage bias voltage approaches the Vbat battery voltage). By comparing the two currents we can determine the point when the power amplifier system 10 starts to compress and thus determine the kink introduction in the control curve.

FIG. 48 presents an embodiment of the proposed efficiency boosting techniques applied to a power amplifier system 10 using the gate power control scheme. In this case the average (envelope) power amplifier system 10 output current and voltage are not directly available to use for a saturation detector. Therefore, the saturation detector in this case needs to be based off the RF signal 482. One mechanism that can be used for detecting the point when the power amplifier system 10 starts compressing is by looking at the drain to source voltage of the output stage bottom device 481 and compare it with the voltage of a device operating at the same current density, but which never enters into triode. The signal sent by the saturation detector 482 is used to create the kink in the control characteristic either through a direct summation with the main bias generator, or through a slope change action on the main bias generator.

Expected variations or differences in the results are contemplated in accordance with the objects and practices of the present invention. It is intended, therefore, that the invention be defined by the scope of the claims which follow and that such claims be interpreted as broadly as is reasonable.

What is claimed is:

1. A non-drain bias power amplifier system, comprising:
   a signal path including driver stages and output stage,
   a power control element with one or more power control ports and uses one or more nonlinear control characteristics; and
   a nonlinear control curve generator driven by at least one of, an input power control signal, a voltage or current saturation sensing signal and a sensed or estimated output power signal, the non-linear control curve generator driving one or more of inputs of the output stage and the driver stages.

2. The system of claim 1, wherein the power control element uses at least one of, one or more piecewise linear characteristics having one or more inflection points, and continuous nonlinear control characteristics.

3. The system of claim 1, wherein the power control element uses at least one of, an open-loop generation of a control characteristics inflection point(s), and a closed-loop generation of the control characteristic inflection point(s).

4. The system of claim 1, wherein the power control element uses at least one of, a manual alignment of the control curve inflection points to power amplifier power control compression points, an automatic (self-alignment) of inflection points with power amplifier compression points, and a combination of manual and automatic alignment.

5. The system of claim 1, wherein the power control element uses at least one of, an intrinsic inflection point(s) generation, and an extrinsic inflection point(s) generation determined by one or more saturation detectors.

6. The system of claim 5, wherein the power control element uses at least one of, a voltage-mode saturation detector(s), a current-mode saturation detector(s), a baseband (envelope) domain saturation detector(s), and an RF domain saturation detector(s).

7. The system of claim 1, wherein the power control element uses at least one of, control characteristics with one or multiple inflection points, and multiple control characteristics having one or more inflection points.

8. The system of claim 1, wherein inflection points are generated by at least one of, adjusting bias of driver stages, adjusting a bias point of an output stage, changing a size of a driver stage, and adjusting bias voltages for main and cascode gates of an output stage.

9. The system of claim 1, wherein control curves inflection points are generated by at least one of, driver and/or output stage bias voltages, driver and/or output stage bias currents, driver stage size adjustments, and a combination of driver and/or output stage bias voltages and currents.

10. The system of claim 1, wherein the power control element uses at least one of, a single port for power amplifier power control at low, moderate, and high power levels, two or more ports for power amplifier power control with at least of portion used at low, moderate and high power levels.

11. The system of claim 1, wherein a main power control technique and an auxiliary power control technique use at least one of, separate power control ports and same control ports, the separate power control ports, and same control ports are sequenced or overlapped with power amplifier compression point positions.

12. The system of claim 1, wherein the power control element uses at least one of, multiple modulation to generate output power level control (amplitude modulation and pulse-width modulation), change a class of operation of power amplifier outputs stage as power level modifies from low to intermediate and then to high.

13. The system of claim 1, wherein the power control element is used with at least one of, a feedback control, a feed-forward control, and a combination of feedback and feed-forward control.

14. The system of claim 1, wherein the power control element is used with a cascode output stage that has at least one of, low-voltage devices, high-voltage devices, and intermediary-voltage devices.

15. The system of claim 1, further comprising:
    a power control block with nonlinear control characteristics with at least one of, breakdown protection blocks, snap-back protection blocks, over-voltage and over-current protection blocks, linearity enhancement blocks, and DC-DC converters that generate constant or variable supply voltages for power amplifier signal path stages.

16. A non-drain power amplifier system, comprising:
    a signal path including driver stages and an output stage; and
    a power control element that uses amplitude and pulse-width modulation to change a power amplifier output power level.

17. The system of claim 16, wherein the power control element uses class C operation of an output stage at low power levels, class B operation at moderate or high power levels, and class B or class AB towards peak output power levels.

18. The system of claim 16, wherein the power control element uses classes of operation for different regions of a power control range selected from at least one of, class C, class B, class AB, class EB.

* * * * *